(12) United States Patent
Kim et al.

(10) Patent No.: US 11,411,062 B2
(45) Date of Patent: Aug. 9, 2022

(54) DISPLAY DEVICE HAVING LIGHT TRANSMISSIVE REGIONS

(71) Applicant: SAMSUNG DISPLAY CO., LTD., Yongin-si (KR)

(72) Inventors: Dong Wook Kim, Asan-si (KR); Won Kyu Kwak, Seongnam-si (KR); Jin Woo Park, Asan-si (KR); Hyun-Chol Bang, Seongnam-si (KR); Sun-Ja Kwon, Gunpo-si (KR); Jeong Woo Park, Suwon-si (KR)

(73) Assignee: SAMSUNG DISPLAY CO., LTD, Yongin-si (KR)

( * ) Notice: Subject to any disclaimer, the term of this patent is extended or adjusted under 35 U.S.C. 154(b) by 56 days.

(21) Appl. No.: 16/739,714

(22) Filed: Jan. 10, 2020

(65) Prior Publication Data
US 2020/0227508 A1    Jul. 16, 2020

(30) Foreign Application Priority Data

Jan. 10, 2019    (KR) .......................... 10-2019-0003450

(51) Int. Cl.
*H01L 29/18*    (2006.01)
*H01L 21/00*    (2006.01)
*H01L 27/32*    (2006.01)

(52) U.S. Cl.
CPC ................................ *H01L 27/3276* (2013.01)

(58) Field of Classification Search
CPC .................... H01L 27/3276; H01L 31/0468
USPC .................................. 438/30–32; 257/88, 98
See application file for complete search history.

(56) References Cited

U.S. PATENT DOCUMENTS

| | | | |
|---|---|---|---|
| 6,982,687 B2 * | 1/2006 | Kim | G09G 3/3283 345/76 |
| 2004/0227703 A1 * | 11/2004 | Lamvik | G09G 3/3233 345/76 |
| 2016/0811148 | 4/2016 | Jeong et al. | |
| 2017/0162111 A1 | 6/2017 | Kang et al. | |
| 2017/0193876 A1 | 7/2017 | Choi et al. | |
| 2018/0206367 A1 | 7/2018 | Oh et al. | |
| 2019/0122608 A1 | 4/2019 | Kang et al. | |
| 2020/0051497 A1 | 2/2020 | Kang et al. | |
| 2020/0124927 A1 | 4/2020 | Kim et al. | |
| 2020/0161400 A1 * | 5/2020 | Ka | G09G 3/3233 |

FOREIGN PATENT DOCUMENTS

| | | |
|---|---|---|
| EP | 3 176772 | 6/2017 |
| EP | 3 640715 | 4/2020 |
| JP | 2002-040990 | 2/2002 |
| JP | 2010-230797 | 10/2010 |

(Continued)

*Primary Examiner* — Calvin Lee
(74) *Attorney, Agent, or Firm* — F. Chau & Associates, LLC

(57) ABSTRACT

An exemplary embodiment of the present invention provides a display device including a first display area having a plurality of first pixel regions and a second display area having both a plurality of second pixel regions and a plurality of light transmissive regions. The second display area includes a plurality of scan lines. The second pixel region includes a plurality of pixel electrodes and a voltage line disposed on a same layer as the pixel electrodes. The voltage line overlaps the scan line to be parallel therewith in the light transmissive region.

21 Claims, 29 Drawing Sheets

(56) References Cited

FOREIGN PATENT DOCUMENTS

| | | |
|---|---|---|
| JP | 2017-167515 | 9/2017 |
| KR | 10-1391100 | 4/2014 |
| KR | 10-2014-0108023 | 9/2014 |
| KR | 10-2015-0140498 | 12/2015 |
| KR | 10-2017-0104097 | 9/2017 |
| KR | 10-2017-0127602 | 11/2017 |
| KR | 10-1873448 | 6/2018 |

* cited by examiner

DISPLAY DEVICE HAVING LIGHT TRANSMISSIVE REGIONS

CROSS-REFERENCE TO RELATED APPLICATION

This application claims priority to and the benefits of Korean Patent Application No. 10-2019-0003450 filed in the Korean Intellectual Property Office on Jan. 10, 2019, the entire contents of which are herein incorporated by reference.

TECHNICAL FIELD

The present disclosure relates to a display device and, more particularly, to a display device having light transmissive regions.

DISCUSSION OF THE RELATED ART

A display device such as a liquid crystal display (LCD) or an organic light emitting diode (OLED) display includes a display panel having a plurality of pixels capable of displaying an image. Each pixel thereof may include a pixel electrode for receiving a data signal. The pixel electrode may be connected to at least one transistor to receive the data signal.

The display device can display an image by the sending of the data signals to the pixel electrodes. Display devices may have various functions in addition to the ability to display an image.

For example, a display device may include an optical device disposed within a bezel (or a border portion) of a front surface of the display device (e.g., one surface on which an image is displayed), and the display device may be able to recognize an object using the optical device. For example, when the optical device is an infrared sensor, the display device may transfer infrared light using an infrared sensor, receive light reflected by the object, and calculate a distance between the display device and the object based on the intensity of the reflected light, and might not display an image if the distance is within a specific distance, for example, so as to deactivate the display of an image when it is detected that a user has placed the display device in close proximity to the user's face, for example, when a call is being taken or made on a smartphone that incorporates such a display therein.

As the bezel of the display device becomes thinner, there might not be adequate bezel space for the disposition of an optical device. In recent years, display devices have been made not to have any bezel at all. Thus, the optical device (such as an infrared sensor) may be disposed elsewhere and an image is displayed on the entire front surface of the display device.

SUMMARY

Exemplary embodiments of the present disclosure provide a display device having functions in addition to image display. These functions may be performed by one or more optical devices which may be disposed behind a portion of the display device that is still capable of displaying an image. Light transmittance of a display area corresponding to an optical device may be enhanced and display quality of a displayed image may be maintained.

An exemplary embodiment of the present invention provides a display device including a first display area and a second display area. The first display area includes a plurality of first pixel regions and the second display area includes both a plurality of second pixel regions and a plurality of light transmissive regions. The second display area includes a plurality of scan lines. The second pixel region includes a plurality of pixel electrodes and a voltage line disposed on a same layer as the pixel electrodes. The voltage line at least partially overlaps the scan line so as to be parallel in the light transmissive region.

Pixel electrodes may be omitted from the light transmissive region.

The second display area may further include a control line, and portions of the scan lines and the control line may be omitted from or otherwise removed in the light transmission region.

The scan lines may include a first scan line and a second scan line, and a portion of the first scan line may be connected to a second scan line of an adjacent pixel column.

A portion of the control line may be connected to a control line of an adjacent pixel column.

The second display area may include a plurality of data lines and driving voltage lines, and the driving voltage lines may be partially omitted from the light transmissive region.

The data lines may be partially omitted in the light transmissive region.

The display device further includes a driver, and the first display area may be disposed between the driver and the second display area.

The second display area may include a plurality of wires, the wires may include a plurality of scan lines and control lines extending in a first direction and a plurality of data lines and driving voltage lines extending in a second direction, and portions of the wires may be bent to be closer to each other in the light transmissive region.

An interval between some wires in the light transmissive region may be smaller than an interval between wires in the second pixel region.

A portion of the light transmissive region where no wires are disposed may have an opening that is formed by partially removing inorganic layers and organic layers.

An exemplary embodiment of the present invention provides a display device including a first display area and a second display area. The first display area includes a plurality of first pixel regions and the second display area includes both a plurality of second pixel regions and a plurality of light transmissive regions. The second display area includes a plurality of wires. The wires include a plurality of scan lines and control lines extending in a first direction and a plurality of data lines and driving voltage line extending in a second direction, and at least one of the wires is omitted from the light transmissive region.

Portions of the wires may be bent to be close to each other in the light transmissive region.

An interval between some wires in the light transmissive region may be smaller than an interval between wires in the second pixel region.

A portion of the light transmissive region where no wires are disposed may have an opening that is formed by partially removing inorganic layers and organic layers.

The second pixel region may include a plurality of pixel electrodes, the second pixel region might not include a voltage line disposed on a same layer as the pixel electrodes, and none of the pixel electrodes might overlap the light transmissive region.

The display device may further include a driver, and the first display area might not be disposed between the driver and the second display area.

An exemplary embodiment of the present invention provides a display device including a first display area and a second display area. The first display area includes a plurality of first pixel regions. The second display area includes both a plurality of second pixel regions and a plurality of light transmissive regions. The second display area includes a plurality of wires. The wires include a plurality of scan lines and control lines extending in a first direction and a plurality of data lines and driving voltage line extending in a second direction. Portions of the wires are bent in the light transmissive region, and an interval between some wires in the light transmissive region is smaller than an interval between wires in the second pixel region.

A portion of the light transmissive region where no wires are disposed may have an opening that is formed by partially removing inorganic layers and organic layers.

The second pixel region may include a plurality of pixel electrodes, the second pixel region might not include a voltage line disposed on a same layer as the pixel electrodes, and the pixel electrodes might not overlap the light transmissive region.

No pixel electrode might be disposed in the light transmissive region.

An exemplary embodiment of the present invention provides a display device including a first display area and a second display area. The first display area includes a plurality of first pixel regions. The second display area includes both a plurality of second pixel regions and a plurality of light transmissive regions. No pixel electrode is disposed in the light transmissive region. The second pixel region includes a plurality of transistors and a plurality of pixel electrodes. The transistors include a switching transistor, a driving transistor, and a third transistor including a first electrode connected to an output electrode of the driving transistor and a second electrode connected to a gate electrode of the driving transistor. Each of the pixel electrodes at least partially overlaps the light transmissive region.

None of the pixel electrodes might overlap the light transmissive region.

The display device might not include a voltage line disposed on a same layer as the pixel electrodes.

The pixels may include a first pixel electrode, a second pixel electrode, and a third pixel electrode. The second pixel region may include a first scan line, a second scan line, and a control line which are disposed side by side in a first direction. The first pixel electrode and the third pixel electrode may have a planar shape having a widest width in the first direction between the first scan line and the control line. The second pixel electrode may have a planar shape having a widest width in the first direction in a region overlapping the second scan line.

According to exemplary embodiments of the present disclosure, it is possible to provide a display device having functions in addition to image display, and which is capable of enhancing light transmittance of a display area corresponding to an optical device and increasing display quality of a displayed image.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF THE EMBODIMENTS

Figure 1:
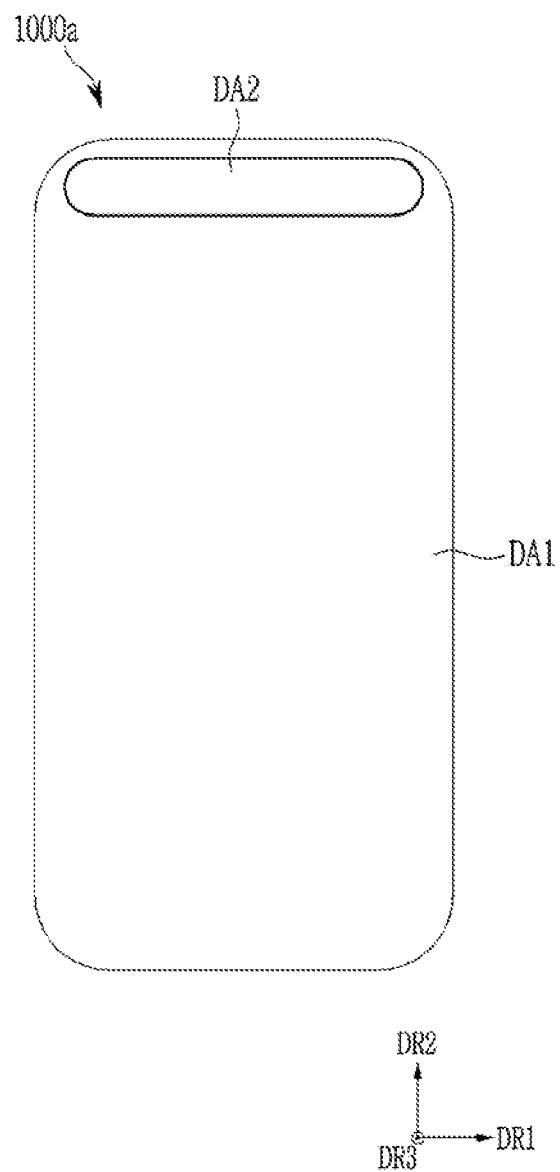
FIG. 1, FIG. 2, and FIG. 3 are schematic layout views illustrating a display area of a display device according to an exemplary embodiment of the present disclosure.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

To more clearly describe and illustrate the present invention, some elements of the present invention have been omitted. Like numerals may refer to like or similar constituent elements throughout the specification and figures.

In the drawings, the thicknesses of layers, films, panels, regions, etc., may be exaggerated for clarity.

It will be understood that when an element such as a layer, film, region, or substrate is referred to as being "on" another element, it can be directly on the other element or intervening elements may also be present. Further, the word "over" or "on" means positioning on or below the object portion, and does not necessarily mean positioning on the upper side of the object portion based on a gravity direction.

In addition, unless explicitly described to the contrary, the word "comprise" and variations such as "comprises" or "comprising" will be understood to imply the inclusion of stated elements but not the exclusion of any other elements.

Further, in the specification, the phrase "in a plan view" means when an object portion is viewed from above, and the phrase "in a cross-sectional view" means when a cross-section taken by vertically cutting an object portion is viewed from the side.

A structure of a display device according to an exemplary embodiment will now be described with reference to FIG. 1 to FIG. 4.

Figure 2:
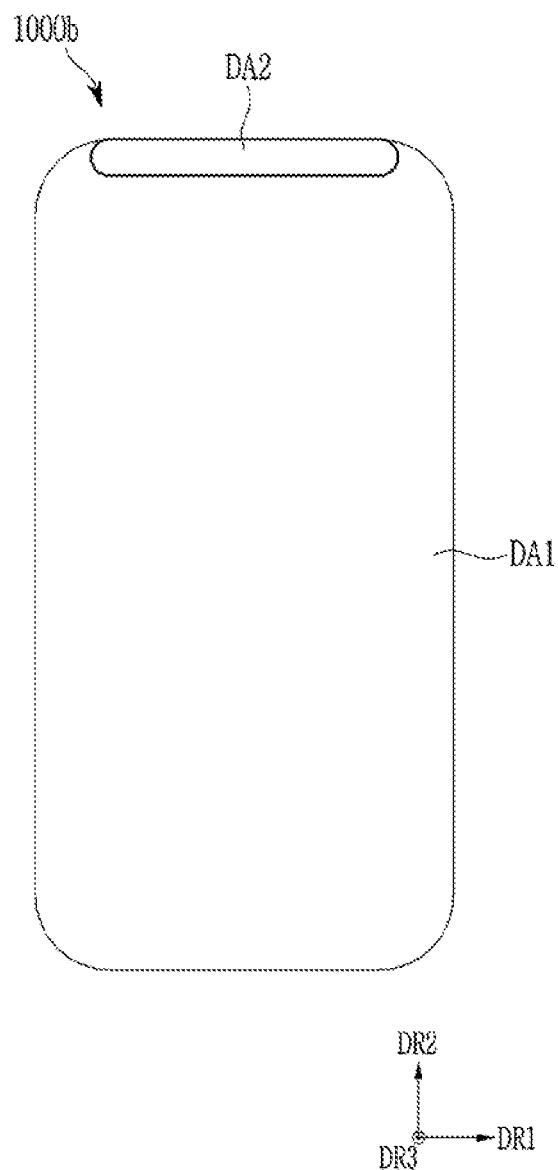
Figure 3:
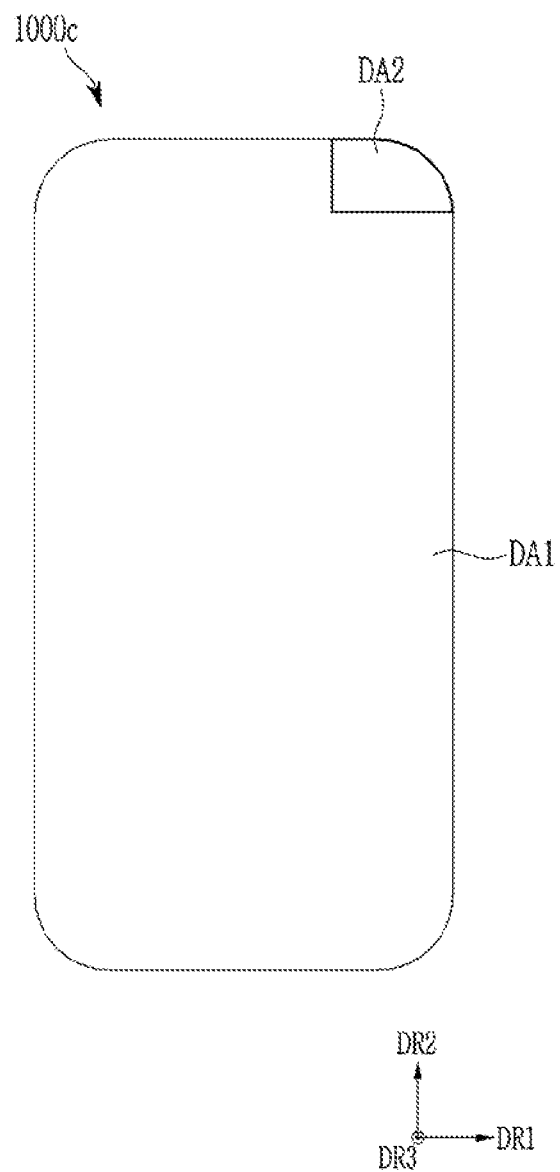
Figure 4:
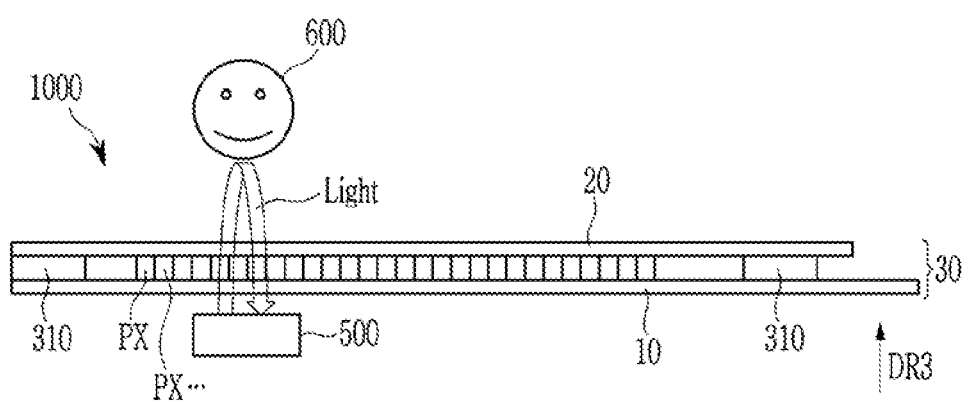
FIG. 4 is a cross-sectional view illustrating a display device according to an exemplary embodiment of the present disclosure.
Figure 5:
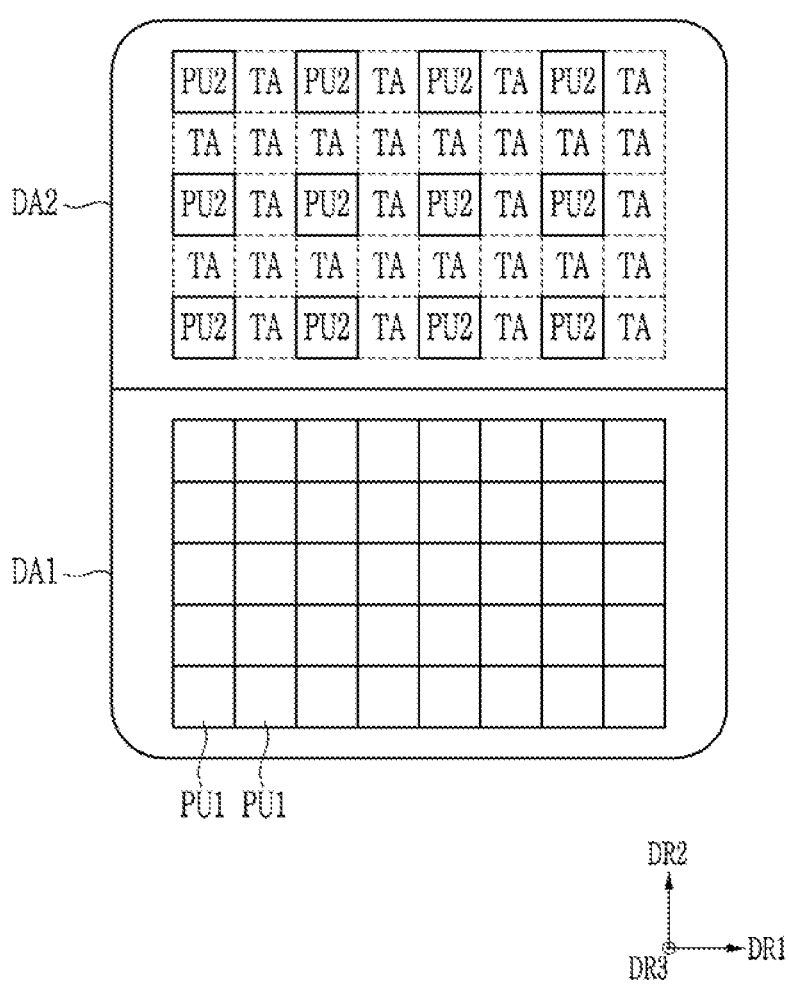
FIG. 5 to FIG. 12 are layout views illustrating a first display area and a second display area of a display device according to an exemplary embodiment of the present disclosure.
Figure 6:
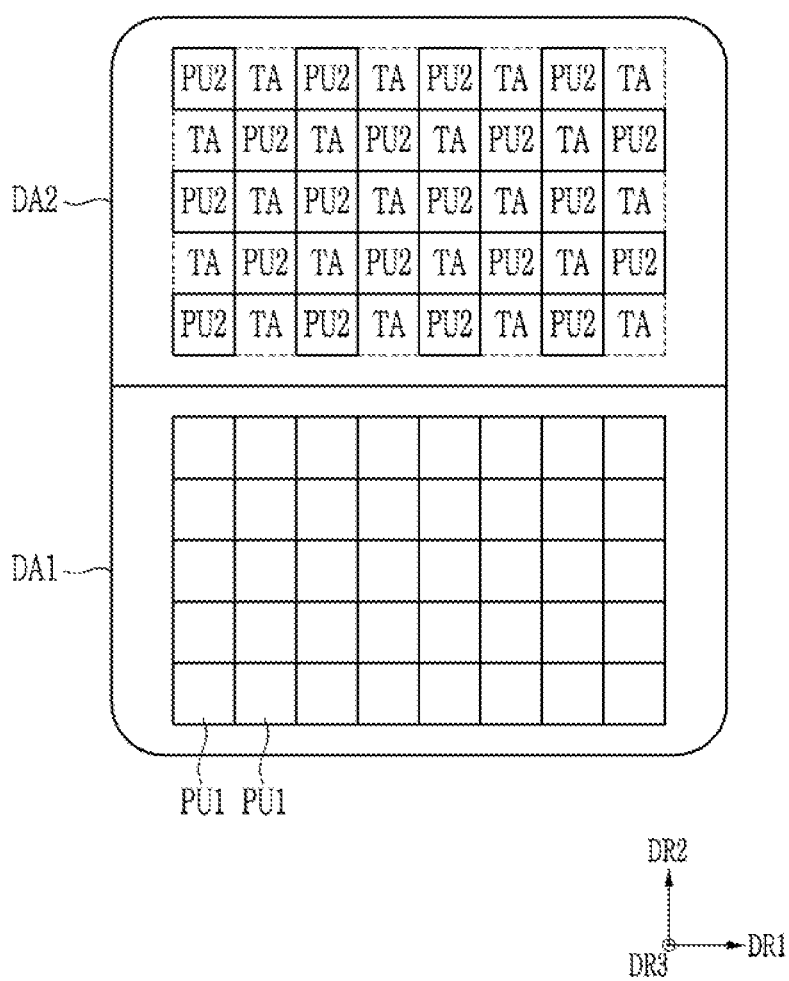
Figure 7:
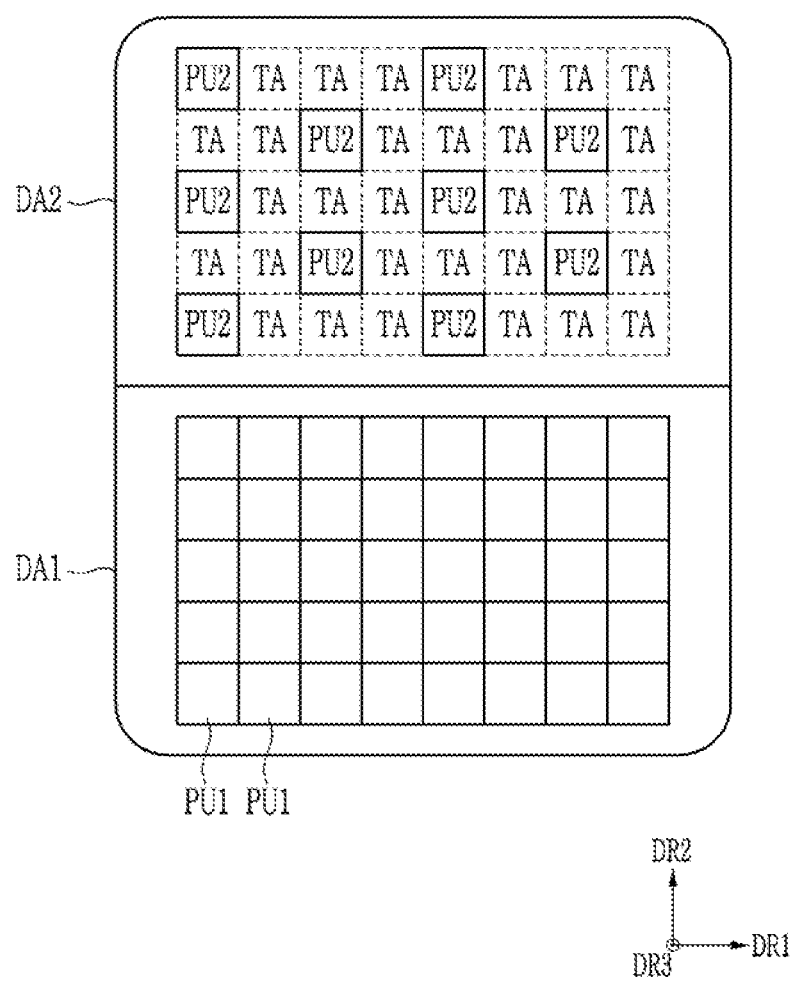
Figure 8:
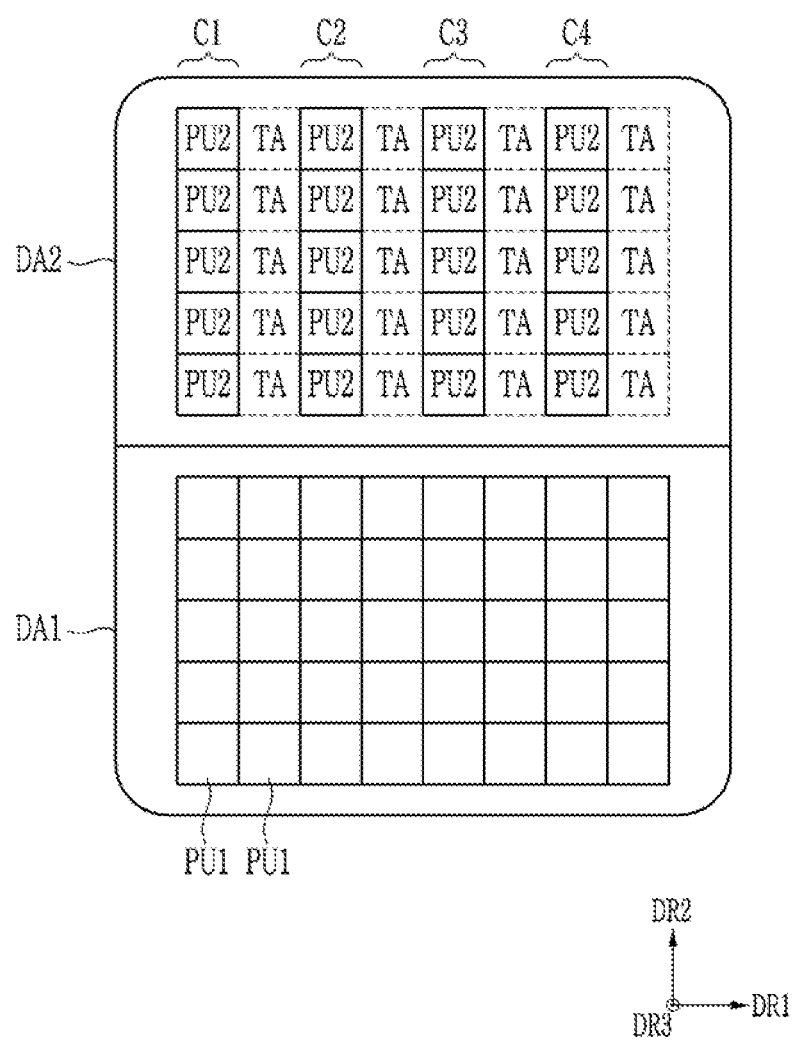
Figure 9:
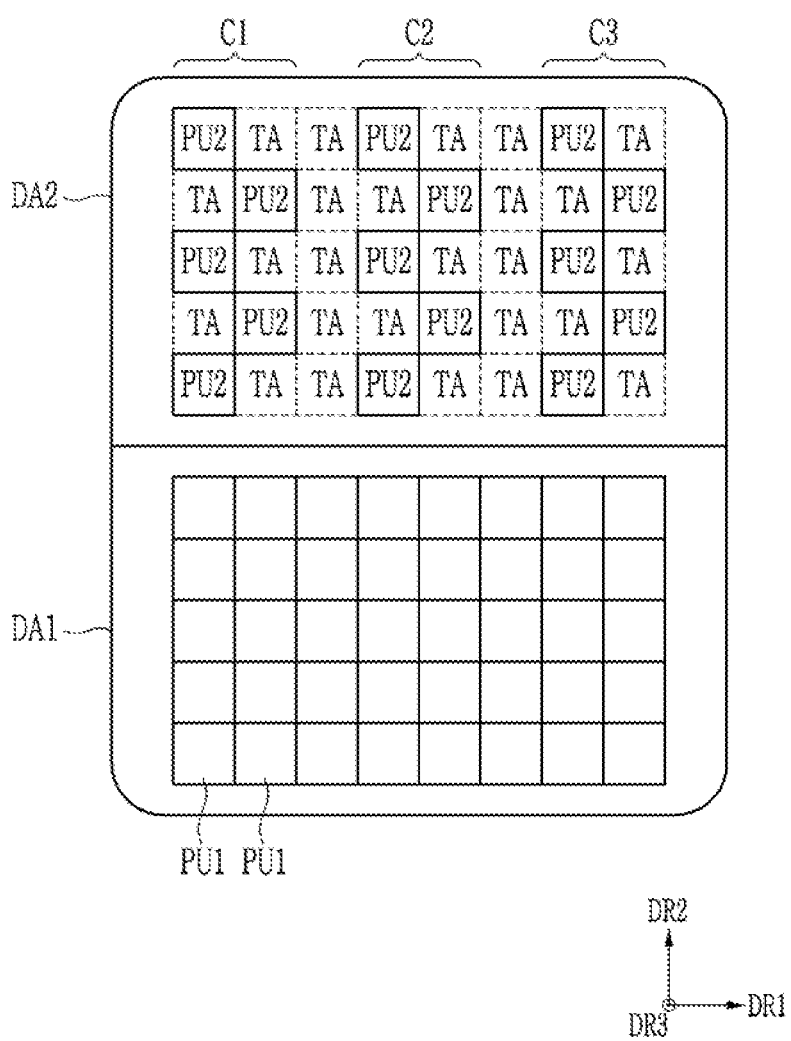
Figure 10:
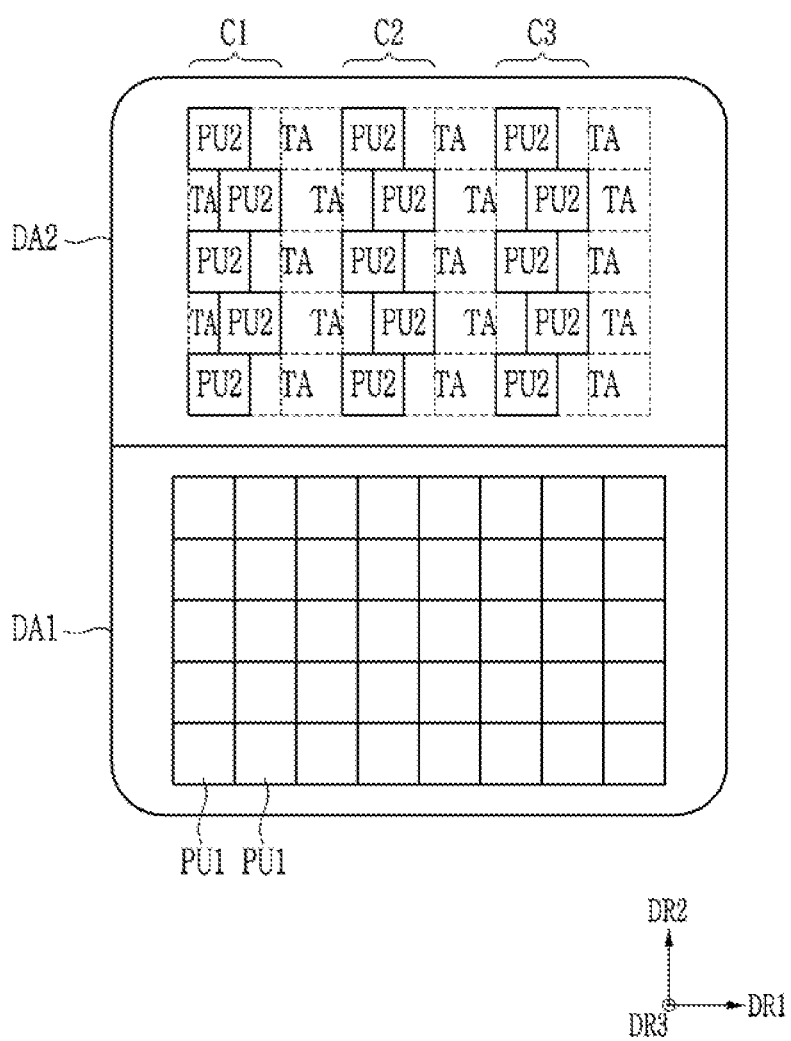
Figure 11:
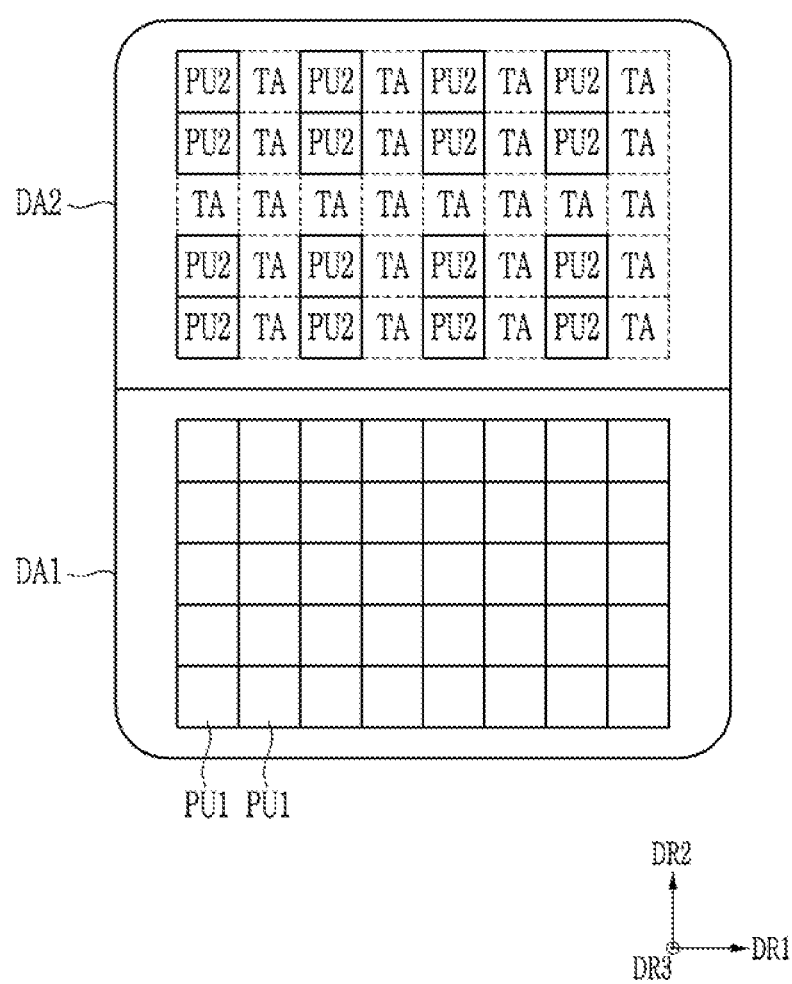
Figure 12:
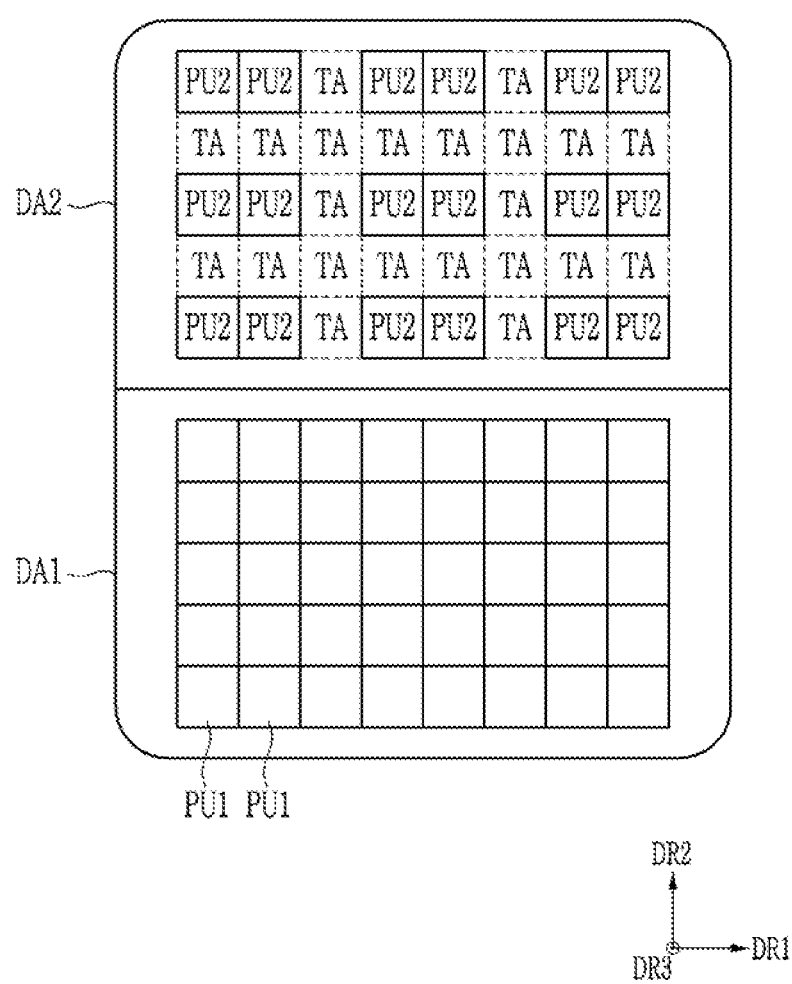

FIG. 1, FIG. 2, and FIG. 3 each represent a schematic layout view of a display area of a display device according to an exemplary embodiment of the present disclosure. FIG. 4 is a cross-sectional view of a display device according to an exemplary embodiment of the present disclosure.

Referring to FIG. 1 to FIG. 4, a display area, which is an area on which an image can be displayed, of a display device 1000, 1000a, 1000b, or 1000c, may include a first display area DA1 and a second display area DA2. The first display area DA1 might only display an image while the second display area DA2 might display an image and may also perform other functions.

More light may be received by or emitted from the second display area DA2 than the first display area DA1.

For example, referring to FIG. 4, the display device, according to an exemplary embodiment of the present disclosure, may include a display panel 30 and an optical device 500 disposed behind the display panel 30, and light having a wavelength used by the optical device 500 may pass through the second display area DA2 at a higher light transmittance than in the first display area DA1.

A ratio of an area occupied by a region on which an image can be displayed, i.e., a pixel region, in the second display area DA2 may be smaller than a ratio of an area occupied by a pixel region in the first display area DA1.

The second display area DA2 includes a pixel region and a light transmissive region, and the light transmissive region has higher light transmittance than the pixel region. No pixels capable of displaying an image are disposed in the light transmissive region. Herein, the pixel may be a unit area where light of an image for an input image signal is emitted.

Referring to FIG. 1, the second display area DA2 may be at least partially surrounded by the first display area DA1, and the second display area DA2 may be disposed proximity to one side of the display device 1000a in a plan view. For example, the first display area DA1 may be disposed between the second display area DA2 and an edge of the display device 1000a in a plan view. For example, the second display area DA2 may be disposed around an upper end of the display device 1000a, and may have a planar shape extending primarily in a first direction DR1 along most of an upper edge of the display device 1000a. As used herein, the phrase "extending primarily" means that the element being so-described is longer in the direction so-mentioned than in all other directions. Thus an element that extends primarily in a given direction is longer in that given direction than in all other directions.

Referring to FIG. 2, the second display area. DA2, according to exemplary embodiment of the present disclosure, is substantially the same as what is shown in FIG. 1, but the first display area DA1 might not be disposed around at least a side of the second display area DA2. For example, one edge of the second display area DA2 may coincide with one edge of the display device 1000b in a plan view. For example, when the second display area DA2 is disposed around the upper edge of the display device 1000b, the first display area DA1 might not be disposed above the second display area DA2.

Referring to FIG. 3, the second display area DA2, according to an exemplary embodiment of the present disclosure, is substantially the same as what is illustrated in FIG. 2, but the second display area DA2 may be disposed adjacent to or near a corner edge of the display device 1000c. For example, one edge of the second display area DA2 may coincide with one corner edge of the display device 1000c in a plan view. For example, when the second display area DA2 is disposed around an upper corner of the display device 1000c, one edge of the second display area DA2 may coincide with an edge of an upper corner of the first display area DA1.

In addition, the second display area DA2 may be disposed at various locations in the display area of the display device, and may have various planar shapes. Although not illustrated, the second display area DA2 may have a circular planar shape around an upper edge of the display device.

Referring to FIG. 4, the display panel 30 included in the display device 1000 may include a substrate 10 disposed in the first display area DA1 and the second display area DA2 described above. For example, the substrate 10 is continuously formed even in the second display area DA2, and there might be no disruption in the continuity of the substrate 10.

A plurality of pixels PX may be formed between the substrate 10 and an encapsulation substrate 20. A sealant 310 positioned between the substrate 10 and the encapsulation substrate 20 may further be disposed along an edge of the display panel 30 so as to seal the substrate 10 to the encapsulation substrate 20 and define a sealed cavity therebetween. The optical device 500 may be disposed below the display panel 30. The optical device 500 may be a camera, a camera flash/flashlight, a sensor, or the like.

The optical device 500 may emit light of a predetermined wavelength range toward an object 600 disposed on the display panel 30, or may receive light reflected from the object 600. The light having the predetermined wavelength may be light having a wavelength that can be processed (e.g. generated and/or sensed) by the optical device 500, and may be light having a wavelength other than the visible light region (e.g. it may be infrared light), which is light of an image displayed by the pixels PX. Light of a specific wavelength may mainly pass through the light transmissive region disposed in the second area display area DA2. When the optical device 500 is an infrared camera, the light of a certain wavelength may have approximately 900 nm-1000 nm or an infrared wavelength band.

The optical device 500 may be disposed corresponding to the entire second display area DA2 in a plan view, or may be arranged corresponding to only a part of the second display area DA2. For example, the optical device 500 may be disposed corresponding to a part of the second display area DA2 illustrated in FIG. 1.

Hereinafter, the first display area DA1 and the second display area DA2 according to an exemplary embodiment of the present disclosure will be described with reference to FIG. 5 to FIG. 12 as well as the aforementioned drawings.

FIG. 5 to FIG. 12 each illustrates a layout view of the first display area DA1 and the second display area DA2 of a display device according to an exemplary embodiment of the present disclosure.

The first display area DA1 may include a plurality of pixel regions PU1, and the second display area DA2 may include a plurality of pixel regions PU2 and light transmissive regions TA.

While this figure shows that the pixel regions PU1 of the first display area DA1 do not adjoin the pixel regions PU2 and transmission regions TA of the second display area DA2, this need not be the case and alternatively, the pixel regions PU1 of the first display area DA1 may adjoin the pixel regions PU2 and transmission regions TA of the second display area DA2 such that there is little to no space therebetween.

In a first display area DA1, the pixel regions PU1 may be arranged in a matrix form having columns and rows, e.g., in the first direction DR1 and in the second direction DR2 which are different from each other, or in two diagonal directions which cross each other. In the second display area DA2, the pixel regions PU2 and the light transmissive regions TA may be arranged in a matrix form, for example, but the present invention is not limited thereto. Herein, the diagonal direction may indicate a direction intersecting both the first direction DR1 and the second direction DR2.

Each of the pixel regions PU1 and PU2 may include a plurality of pixels or just one pixel. The structure and/or shape of the pixel region PU1 and the structure and/or shape of the pixel region PU2 may be the same as or different from each other. Structures of two neighboring pixel regions PU1 in the first display area DA1 may be the same or different, and structures of two neighboring pixel regions PU2 in the second display area DA2 may be the same or different. For example, structures of two pixel regions PU1 neighboring in a row or column direction in the first display area DA1 may be symmetrical with respect to each other, and structures of two pixel regions PU2 neighboring in a row or column direction in the second display area DA2 may be symmetrical with respect to each other.

Hereinafter, a structure of an emissive display device as an example of a display device according to an exemplary embodiment will be described with reference to FIG. 13 and FIG. 14 together with the aforementioned drawings.

Figure 13:
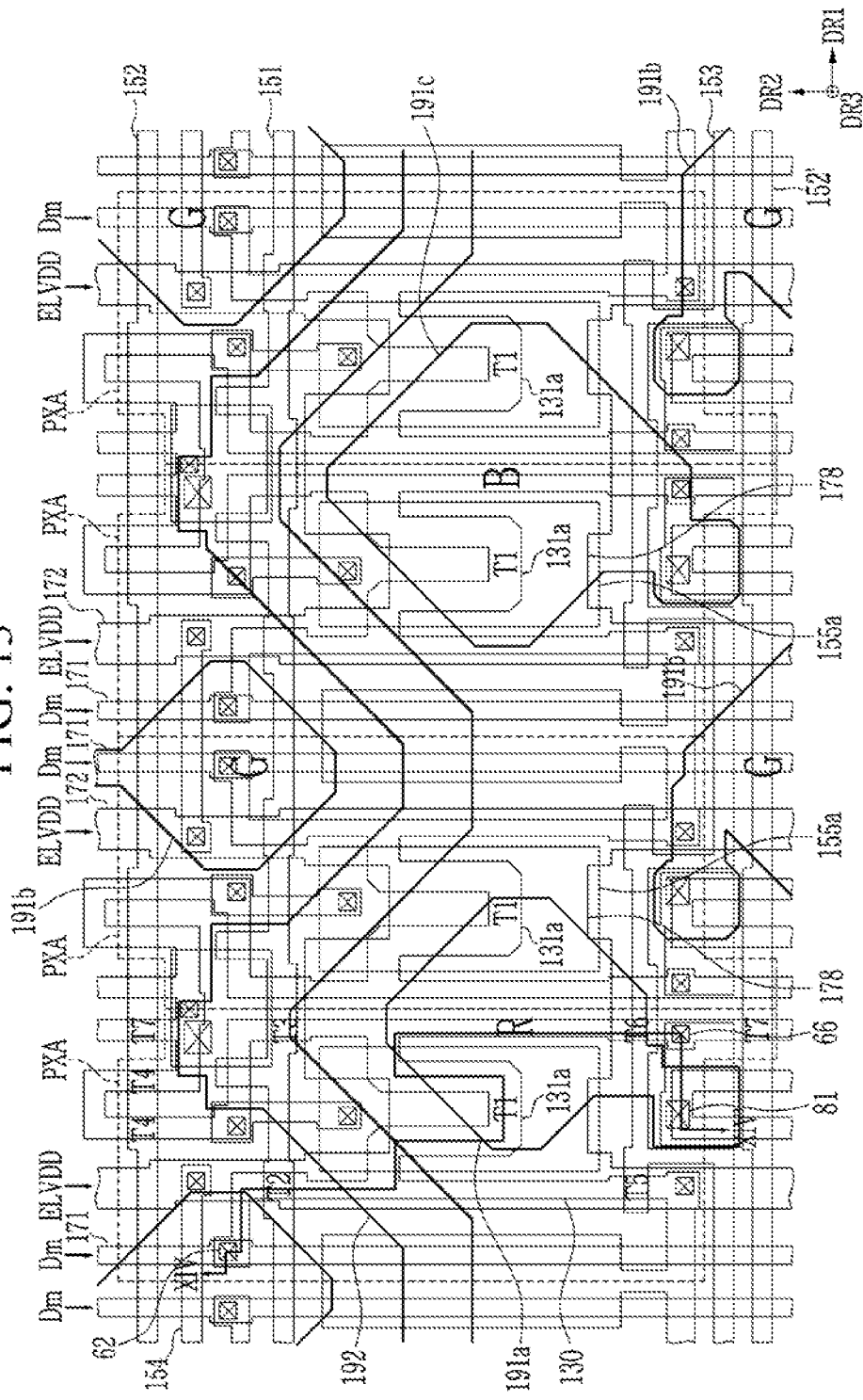
FIG. 13 is a layout view illustrating a display area of a display device according to an exemplary embodiment of the present disclosure.

FIG. 13 is a layout view illustrating a display area of a display device according to an exemplary embodiment of the present disclosure. FIG. 14 is a cross-sectional view illustrating the display device taken along a line XIV-XIV' of FIG. 13.

Referring to FIG. 13, the display device, according to an exemplary embodiment of the present invention, may include a plurality of pixel circuit areas PXA in which circuits of pixels corresponding to a plurality of pixels R, G, and B are formed. The pixel circuit areas PXA may be arranged in a matrix form in the first direction DR1 and the second direction DR2. As used here, the phrase "matrix form" may mean that the constituent elements are arranged in horizontal rows and vertical columns without staggering.

Each of the pixel circuit areas PXA may include a plurality of transistors T1, T2, T3, T4, T5, T6, and T7 connected to a plurality of scan lines 151, 152, and 152', a control line 153, a data line 171, and a driving voltage line 172. The scan lines 151, 152, and 152' include a first scan line 151, a second scan line 152, and a third scan line 152'. The third scan line 152' may be a second scan line 152 of another neighboring pixel.

The scan lines 151, 152, and 152' may transfer scan signals. The second scan line 152 may transfer a scan signal of a stage previous to the first scan line 151, and the third scan line 152' may transfer a scan signal subsequent to that of the second scan line 152. The control line 153 may transfer a control signal, and particularly may transfer a light emission control signal, capable of controlling light emission of a light emitting diode corresponding to the pixels R, G, and B.

The data line 171 may transfer a data signal Dm, and the driving voltage line 172 may transfer a driving voltage ELVDD. The driving voltage line 172 may include a plurality of extensions 178 that protrude in the first direction DR1.

A channel of each of the plurality of transistors T1, T2, T3, T4, T5, T6, and T7 may be formed inside an active pattern 130. The active pattern 130 may be curved in various shapes, and may include a semiconductor material such as amorphous/polycrystalline silicon or an oxide semiconductor. For example, the transistor T1 may include a channel region 131a of the active pattern 130 that is curved at least once.

The display device, according to an exemplary embodiment, may include a plurality of pixel electrodes 191a, 191b, and 191c corresponding to the respective pixel circuit area PXA, and a voltage line 192. Each of the pixel electrodes 191a, 191b, and 191c may be disposed corresponding to each of the pixels R, G, and B. The pixel electrodes may include a first pixel electrode 191a, a second pixel electrode 191b, and a third pixel electrode 191c. The first pixel electrode 191a of the red pixel R may be smaller than the third pixel electrode 191c of the blue pixel B, and the second pixel electrode 191b of the green pixel G may be smaller than the first pixel electrode 191a of the red pixel R.

The voltage line 192 may be curved around edges of the pixel electrodes 191a, 191b, and 191c adjacent thereto, and may transfer a constant voltage such as an initialization voltage that can initialize nodes of the pixel circuit areas PXA.

A cross-sectional structure of a display device according to an exemplary embodiment will now be described with reference to FIG. 14 together with FIG. 13.

The display device, according to an exemplary embodiment, includes a substrate 110.

A buffer layer 120, which is an insulating layer, may be disposed on the substrate 110, and the active pattern 130 may be disposed thereon. The active pattern 130 may include channel regions 131a, 131b, and 131f and conductive regions 131. The conductive regions 131 are disposed on opposite sides of the respective channel regions 131a, 131b, and 131f, and may be source and drain regions of the corresponding transistors.

A gate insulating layer 140 may be disposed on the active pattern 130.

A first conductive layer including the scan lines 151, 152 and 152', the control line 153, and a driving gate electrode 155a may be disposed on the gate insulating layer 140.

An interlayer insulating layer 160 may be disposed on the first conductive layer and the gate insulating layer 140.

At least one of the buffer layer 120, the gate insulating layer 140, and the interlayer insulating layer 160 may include an inorganic insulating material such as a silicon nitride, a silicon oxide, or a silicon oxynitride, and/or an organic insulating material.

The interlayer insulating layer 160 and the gate insulating layer 140 may include a contact hole 62 disposed on a source region connected to the channel region 131b of the transistor T2 in the conductive region 131 of the active pattern 130, a contact hole 66 disposed on the drain region connected to the channel region 131f of the transistor T6 in the conductive region 131 of the active pattern 130, and the like.

A second conductive layer including the data line 171, the driving voltage line 172, and a connector 179 may be disposed on the interlayer insulating layer 160.

The data line 171 may be connected to a source region connected to the channel region 131b of the transistor T2 through the contact hole 62. The extension 178 of the driving voltage line 172 may at least partially overlap the driving gate electrode 155a with the interlayer insulating layer 160 interposed therebetween to form a capacitor Cst. The connector 179 may be connected to a drain region connected to the channel region 131f of the transistor T6 through the contact hole 66.

At least one of the first conductive layer and the second conductive layer is made of a conductive material such as copper (Cu), aluminum (Al), molybdenum (Mo), titanium (Ti), tantalum (Ta), and/or an alloy of at least two metals thereof.

A passivation layer 180 may be disposed on the second conductive layer and the interlayer insulating layer 160. The passivation layer 180 may include an organic insulating material such as a polyacryl-based resin, a polyimide-based resin, or the like, and an upper surface of the passivation layer 180 may be substantially flat. The passivation layer 180 may include a contact hole 81 disposed on the connector 179.

A third conductive layer including the pixel electrodes 191a, 191b, and 191c and the voltage line 192 may be disposed on the passivation layer 180. Each of the pixel electrodes 191a, 191b, and 191c may be connected to the connector 179 through the contact hole 81. The third conductive layer may include a transflective conductive material or a reflective conductive material.

An insulating layer 350 may be disposed on the third conductive layer. The insulating layer 350 may include an organic insulating material, and may have an opening 351 disposed above each of the pixel electrodes 191a, 191b, and 191c.

An emission layer 370 may be disposed above the pixel electrodes 191a, 191b, and 191c. The emission layer 370 may include a portion positioned within the opening 351 and a portion disposed above the insulating layer 350. The emission layer 370 may include an organic emission material or an inorganic emission material.

A common electrode 270 may be disposed on both the emission layer 370 and the insulating layer 350. The common electrode 270 may also be formed on the insulating layer 350. The common electrode 270 may include a conductive transparent material. For example, the common electrode 270 may include silver (Ag).

A common layer such as a hole-injection layer, a hole transport layer, an electron-injection layer, an electron transport layer, or the like may be disposed between the insulating layer 350 and the common electrode 270, between the emission layer 370 and the common electrode 270, and/or between the emission layer 370 and the pixel electrodes 191a, 191b, and 191c. The common layer may be formed entirely in the first display area DA1 and the second display area DA2.

The pixel electrodes 191a, 191b, and 191c form a light emitting diode ED as a light emitting element together with the light emitting layer 370 and the common electrode 270.

The common electrode 270 may serve as a cathode, and the pixel electrodes 191a, 191b, and 191c may serve as an anode, or vice versa.

The first display area DA1 described above may have the structure illustrated in FIG. 13 and FIG. 14. A planar structure and a sectional structure of the pixel region PU2 of the second display area DA2 may have a part of the structure illustrated in FIG. 13 and a cross-sectional stacking structure illustrated in FIG. 14.

Figure 14:
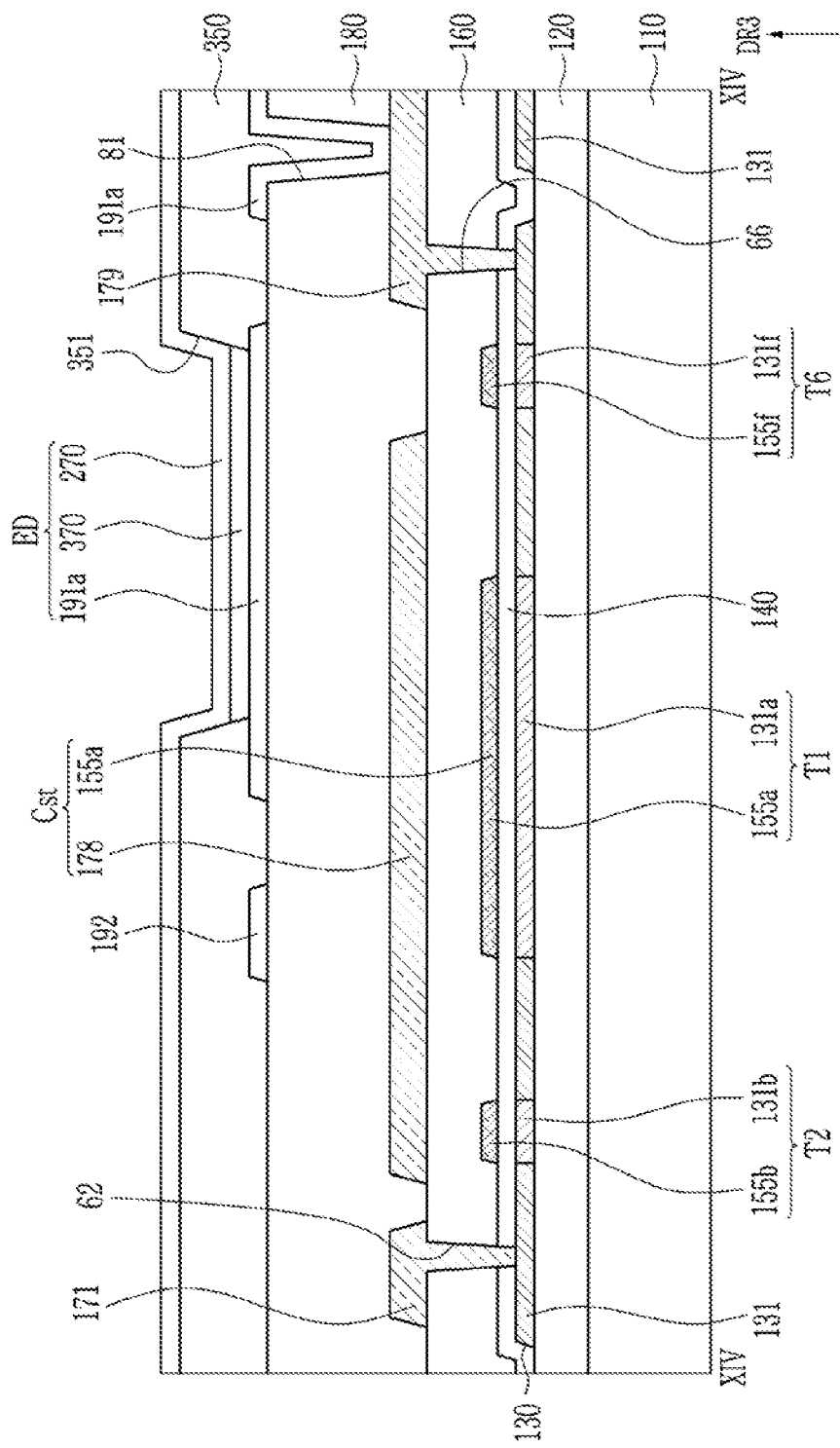
FIG. 14 is a cross-sectional view illustrating the display device taken along a line XIV-XIV' of FIG. 13.

In the light transmissive region TA of the second display area DA2, at least a part of the structure necessary for displaying an image among the structures shown in FIG. 13 and FIG. 14 might be omitted. For example, in the light transmissive region TA, at least some of the active pattern 130, the driving gate electrode 155a, the extension 178 of the driving voltage line 172, the pixel electrodes 191a, 191b, and 191c, and the emission layer 370 might not be provided. Accordingly, the light transmittance in the light transmissive region TA may be higher than the light transmittance in the pixel regions PU1 and PU2.

Hereinafter, a structure of the light transmissive region TA of the second display area DA2 of the display device according to an exemplary embodiment will be described in detail with reference to FIG. 15.

Figure 15:
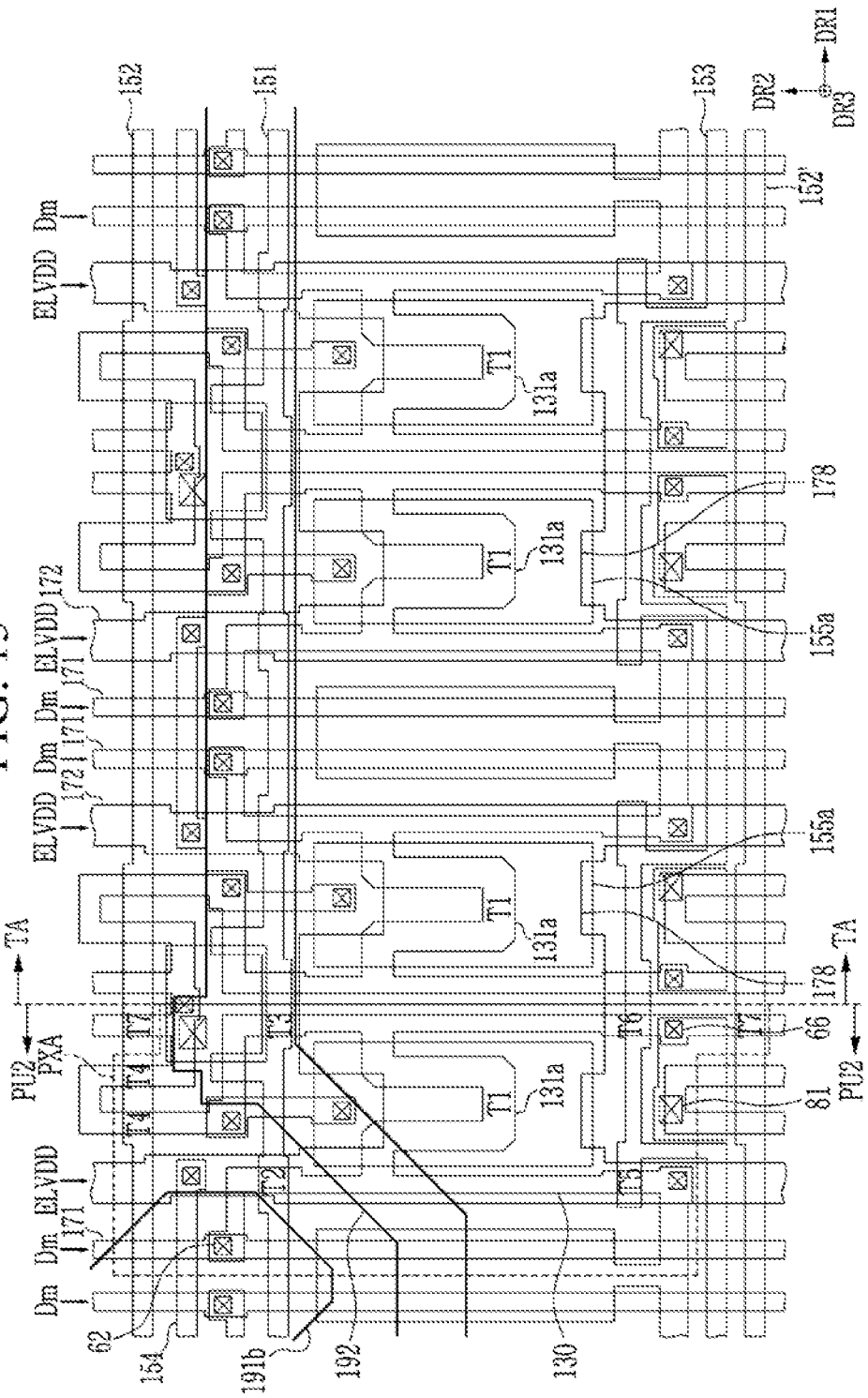
FIG. 15 is a schematic view illustrating a pixel region and a light transmissive region of a second display area.

FIG. 15 illustrates the pixel region PU2 and the light transmissive region TA of the second display area DA2. Referring to FIG. 15, the voltage line 192 at least partially overlaps the first scan line 151 in the light transmissive region TA of the second display area DA2. In addition, the pixel electrodes 191a, 191b, and 191c are not disposed in the light transmissive region TA.

For example, referring to FIG. 13, the voltage line 192 of the pixel region PU2 is disposed in a zigzag bent shape between the pixel electrodes 191a, 191b, and 191c. The voltage line 192 at least partially overlaps the third transistor T3 so as to prevent the threshold voltage of the third transistor T3 from being changed due to light. The voltage line 192 may be formed of a same material as the pixel electrodes 191a, 191b, and 191c.

Referring to FIG. 15, the pixel electrodes 191a, 191b, and 191c are omitted from the light transmissive region TA. This structure may increase the light transmittance of the light transmissive region TA. The pixel electrodes 191a, 191b, and 191c are not disposed in the light transmissive region TA, but the voltage line 192 is not removed so that the connection with the neighboring pixel region PU2 may be maintained.

In this case, when the voltage line 192 is disposed to have the zigzag shape in the same manner as in the pixel region PU2 of FIG. 13, light is blocked and the light transmittance is reduced in a region overlapping the voltage line 192. However, when the voltage line 192 at least partially overlaps the first scan line 151 in the light transmissive region TA as illustrated in FIG. 15, the light blocking due to the voltage line 192 may be minimized, and the light transmittance in the light transmissive region TA may be increased. The first scan line 151 is disposed in the region where light is blocked due to the first scan line 151, and thus even when the voltage line 192 is overlapped therewith, the entire light transmittance is not reduced.

FIG. 15 illustrates a configuration in which the voltage line 192 overlaps the first scan line 151, which is merely an example, and alternatively, the voltage line 192 may overlap other scan lines 152 and 152'.

Hereinafter, various exemplary embodiments of the present disclosure will be described focusing on the transmissive region of the second display area DA2.

Figure 16:
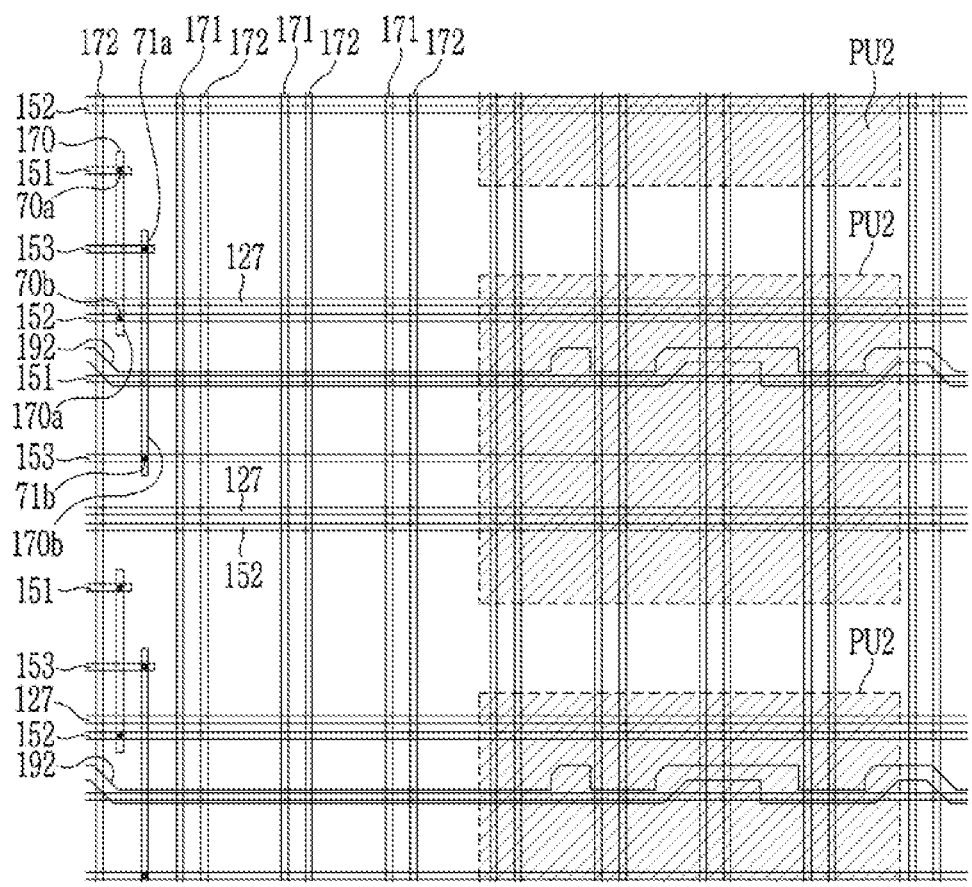
FIG. 16 is a schematic view illustrating a second display area of a display device according to an exemplary embodiment of the present invention.

FIG. 16 illustrates the second display area DA2 of a display device, according to an exemplary embodiment of the present invention. Referring to FIG. 16, the pixel region PU2 of the second display area DA2 is illustrated as a dotted-line region and a hatched region. The pixel disposition of the pixel region PU2 may have the structure illustrated in FIG. 13, and a detailed description thereof will be omitted. Alternatively, the pixel disposition of the pixel region PU2 may have the structure illustrated in FIG. 28 to be described later, and a detailed description thereof will be omitted. The present exemplary embodiment is characterized by the wire disposition of the transmissive region TA of the second pixel region DA2, and will be described based on the wire disposition of the transmissive region TA.

Referring to FIG. 16, the display device includes an initialization voltage line 127, a first scan line 151, a second scan line 152, and a control line 153. According to an exemplary embodiment of the present disclosure, the initialization voltage line 127 may be omitted.

In FIG. 16, the portion not partitioned by the pixel region PU2 corresponds to the light transmissive region TA. In FIG. 16 and the following drawings, a portion excluding the region indicated by the pixel region PU2 is the light transmissive region TA.

Referring to FIG. 16, portions of the first scan line 151 and the control line 153 are omitted from the light transmissive region TA. The omitted first scan line 151 may be connected to the second scan line 152 disposed in another column by a scan connection line 170a. The omitted control line 153 may be connected to the second scan line 153 disposed in another column by a control connection line 170b.

The first scan line 151 and the second scan line 152 are connected to the scan connection line 170a through contact holes 70a and 70b. The control line 153 is connected to the control connection line 170b through contact holes 71a and 71b.

As illustrated in FIG. 16, the pixel electrodes 191a, 191b, and 191c are not disposed in the light transmissive region TA of the second display area DA2. However, since the initialization voltage line 127, the scan lines 151 and 152, the control line 153, the data line 171, the driving voltage line 172, and the like are disposed in the light transmissive region TA, the light transmittance is reduced by such lines.

However, the display device according to the exemplary embodiment of FIG. 16 increases the transmittance of light in the light transmissive region TA by omitting portions of the scan lines 151 and 152 and the control line 153 disposed in the light transmissive region TA of the second display area DA2.

Referring to FIG. 16, the first scan line 151 is connected to the second scan line 152. In a region that is not illustrated in FIG. 16, the first scan line 151 and the second scan line 152 may be connected to each other, and the same signal may be supplied thereto. Accordingly, even when the first scan line 151 is connected to the second scan line 152 of another adjacent pixel region, the scan signal might not be changed.

FIG. 16 illustrates a configuration in which both the first scan line 151 and the control line 153 are connected with the second scan line 152 and the control line 153 of another column, but one of the two lines may be omitted.

Figure 17:
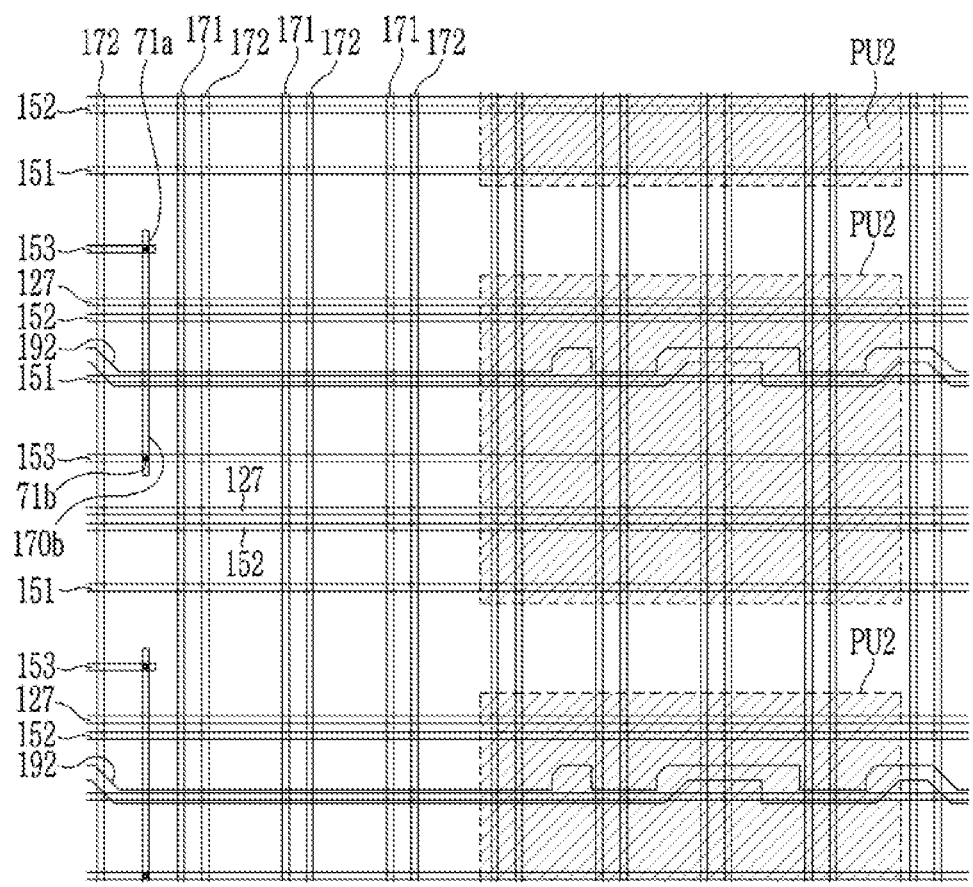
FIG. 17 is a schematic view illustrating an exemplary embodiment in which a control line is omitted.
Figure 18:
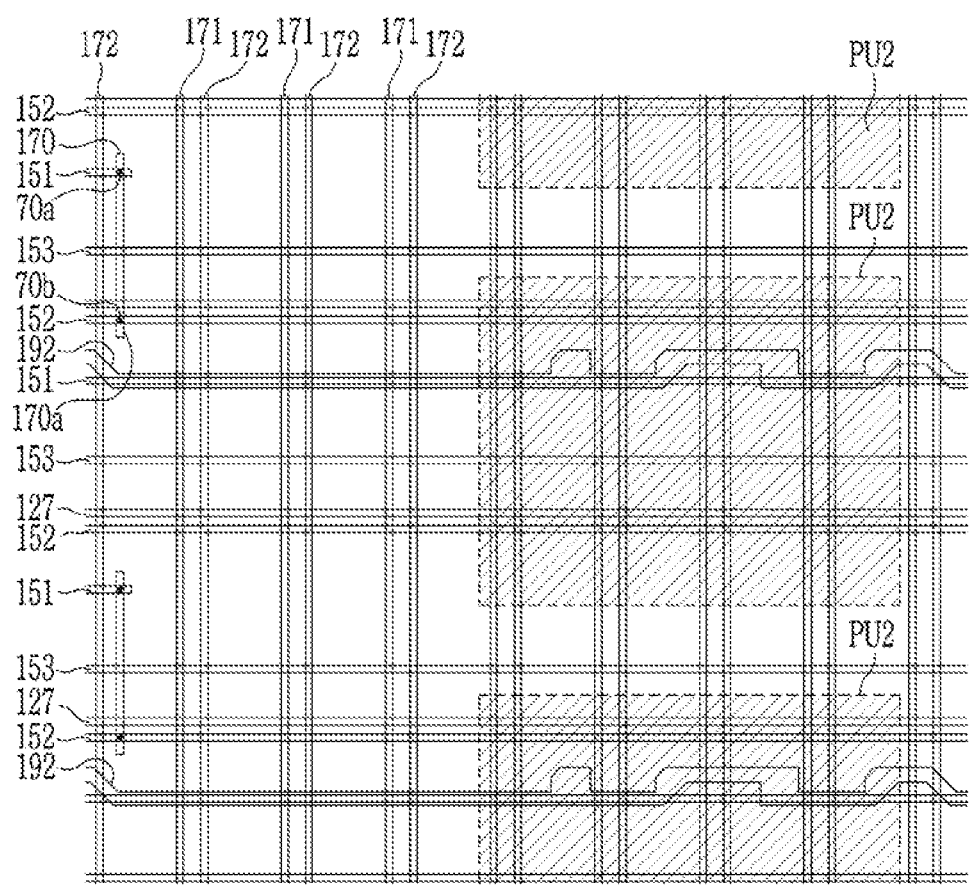
FIG. 18 is a schematic view illustrating an exemplary embodiment in which a first scan line is omitted.

FIG. 17 illustrates an exemplary embodiment in which the control line 153 is omitted. FIG. 18 illustrates an exemplary embodiment in which the first scan line 151 is omitted. Detailed description of the same constituent elements is omitted in FIG. 17 and FIG. 18.

In FIG. 16 to FIG. 18, the voltage line 192 at least partially overlaps the first scan line 151. However, the voltage line 192 may at least partially overlap the second scan line 152, and the voltage line 192 may have a zigzag shape as illustrated in FIG. 13.

Figure 19:
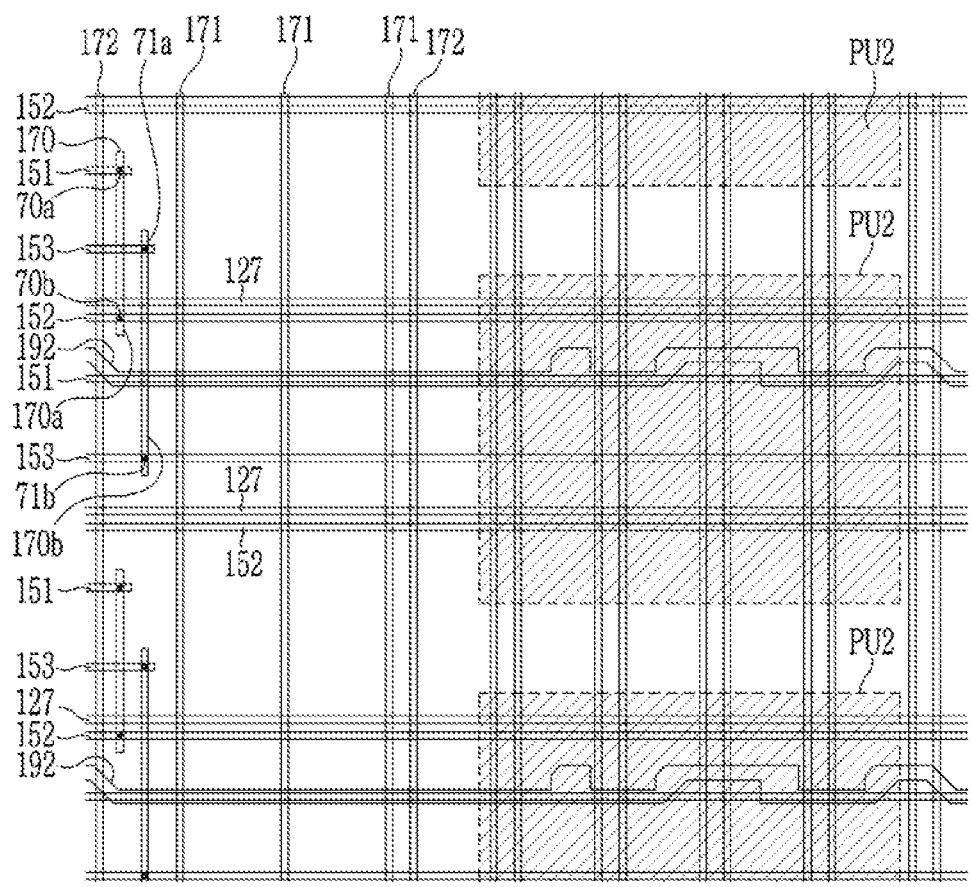
FIG. 19 is a schematic view illustrating a second display area of a display device according to an exemplary embodiment of the present disclosure.

Hereinafter, a display device, according to an exemplary embodiment of the present invention, will be described with reference to FIG. 19. Referring to FIG. 19, a portion of the driving voltage line 172 of the light transmissive region TA is omitted in the display device according to an exemplary embodiment. The driving voltage line 172 transfers the driving voltage ELVDD. The light transmittance of the light transmitting region TA can be increased by removing the driving voltage line 172 of the light transmissive region TA.

Figure 28:
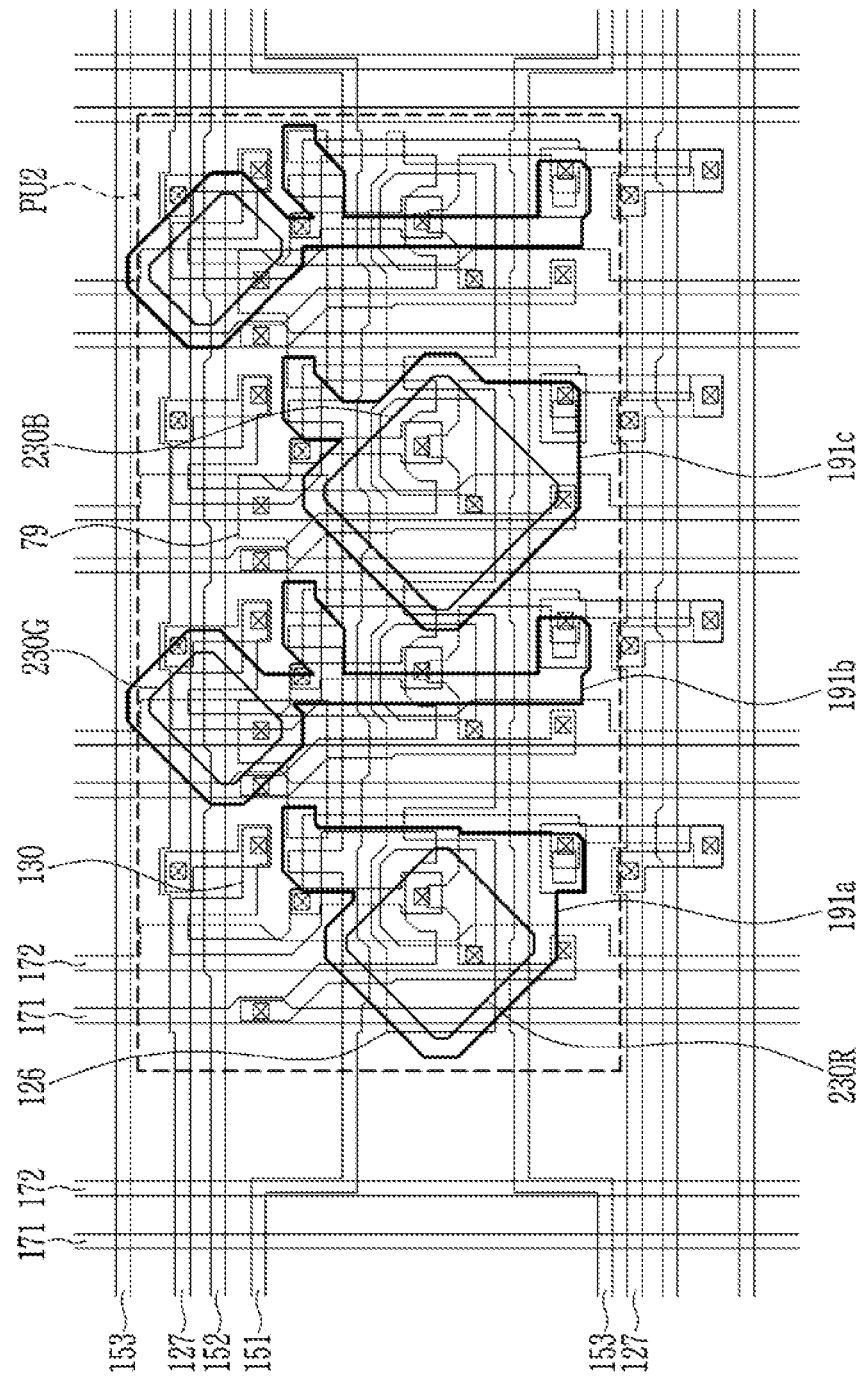
FIG. 28 is a schematic view illustrating a second display area of a display device according to an exemplary embodiment of the present disclosure.
Figure 29:
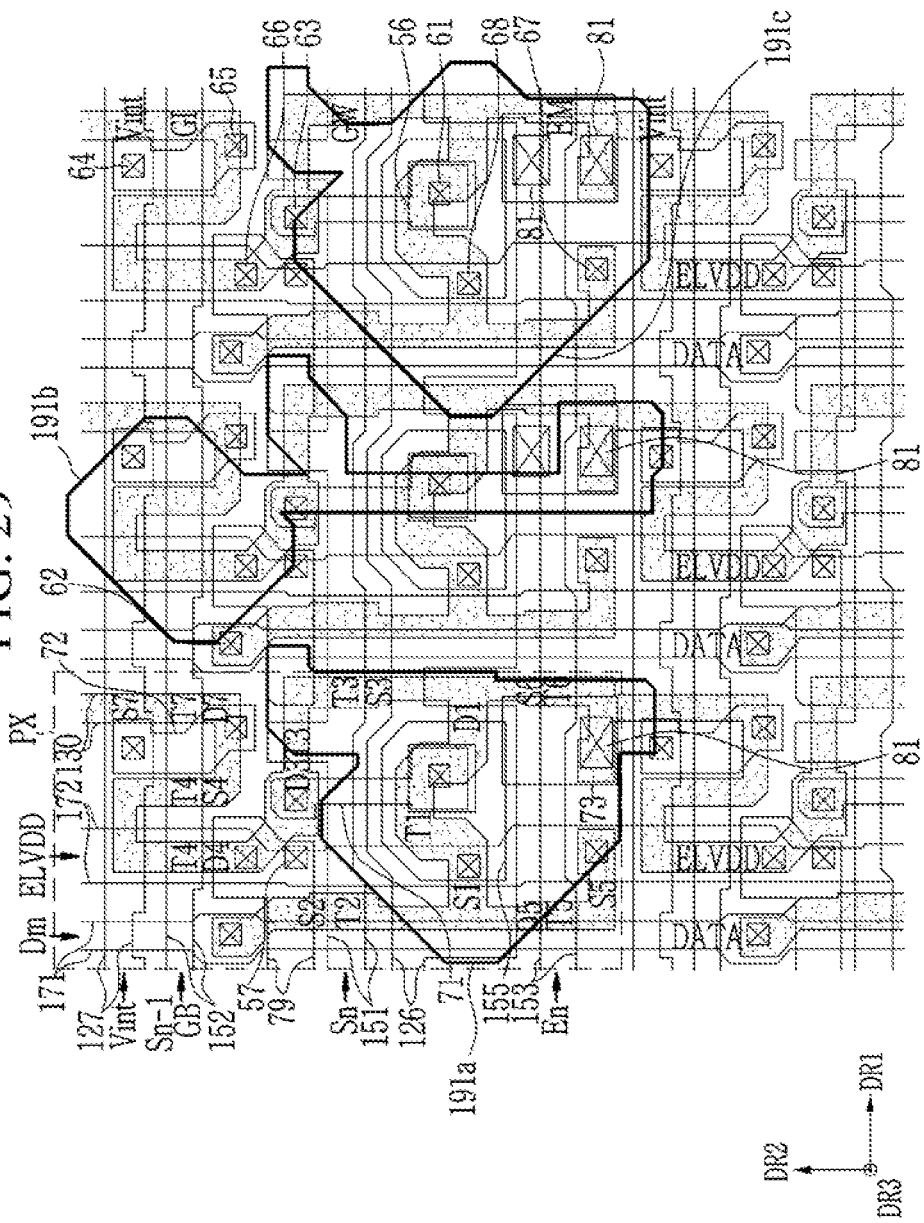
FIG. 29 is a schematic view illustrating a pixel region of FIG. 28 in more detail.

Although not illustrated in FIG. 19, the driving voltage lines 172 neighboring each other in the first direction DR1 are connected to each other in the pixel region through a separate connector. This configuration is illustrated in FIG. 28 and FIG. 29. Therefore, even when a part of the driving voltage line 172 is omitted in the light transmissive area TA of the second display area DA2, the driving of the display device is not affected.

FIG. 19 illustrates a configuration in which the driving voltage line 172 is omitted from the structure where both the first scan line 151 and the control line 153 are connected to the second scan line 152 and the control line 153 of another column, but the present invention is not limited thereto.

Figure 20:
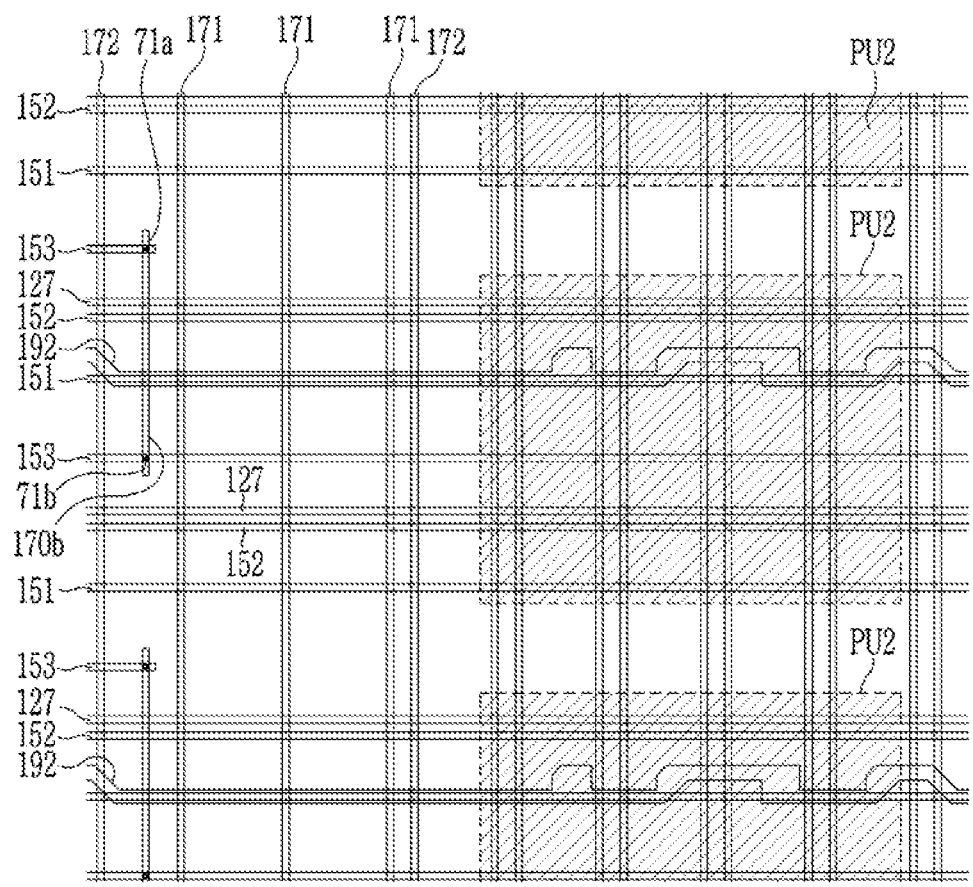
FIG. 20, FIG. 21, and FIG. 22 are schematic views illustrating a display device according to an exemplary embodiment of the present disclosure.
Figure 21:
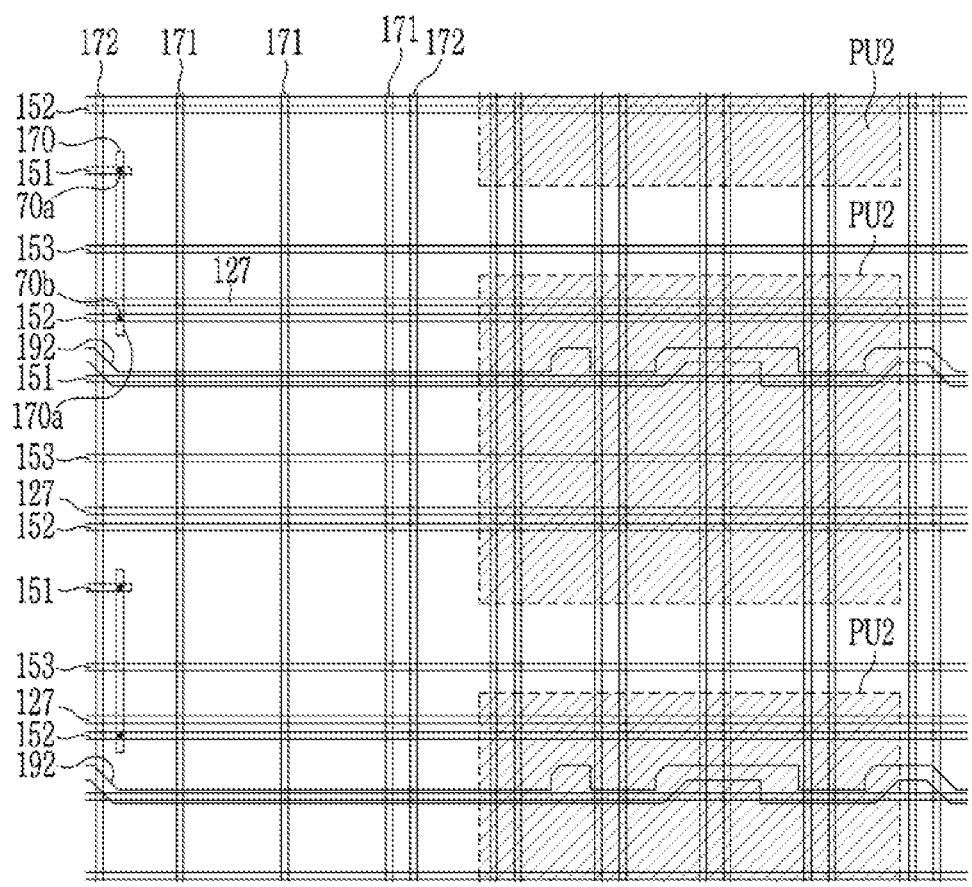
Figure 22:
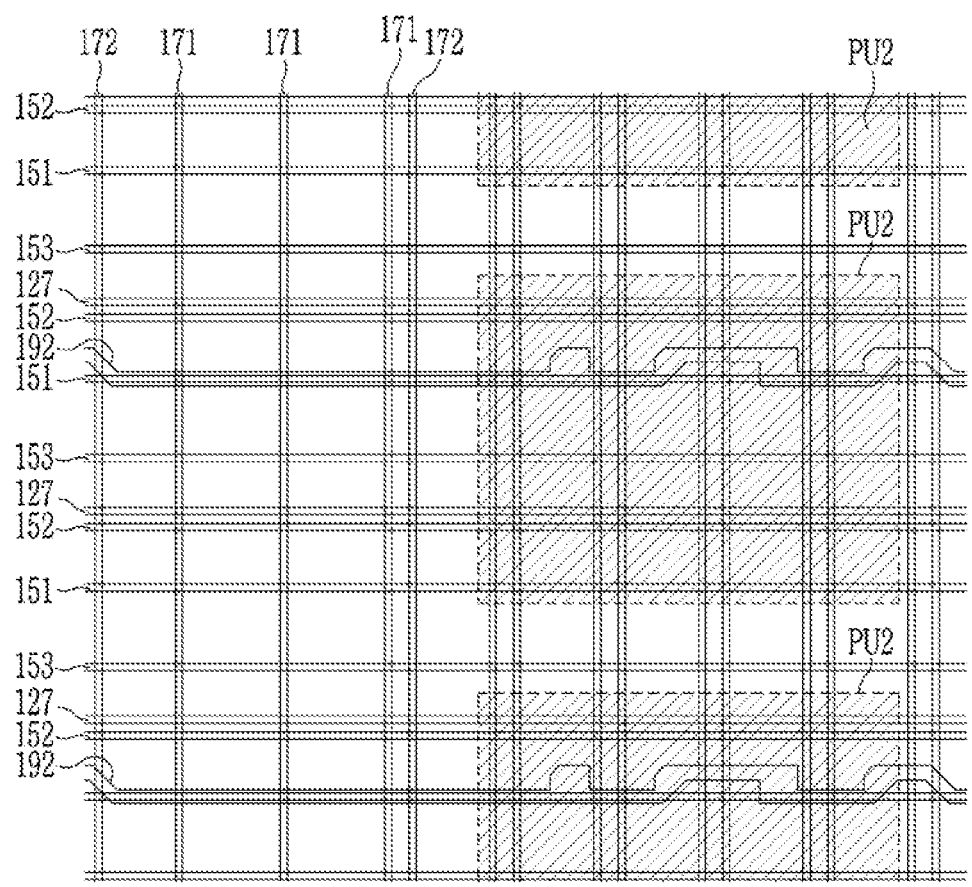

FIG. 20, FIG. 21, and FIG. 22 each illustrate a display device according to an exemplary embodiment. Referring to FIG. 20, a portion of the control line 153 and a portion of the driving voltage line 172 are omitted from the light transmissive region TA. Alternatively, referring to FIG. 21, a portion of the first scan line 151 and a portion of the driving voltage line 172 are omitted from the light transmissive region TA.

Alternatively, referring to FIG. 22, in the light transmissive region TA, the driving voltage line 172 may be omitted without omitting a portion of the scan lines 151 and 152 and the control line 152.

FIG. 19 to FIG. 22 illustrate a configuration in which two of three driving voltage lines 172 disposed between the adjacent pixel regions PU2 are omitted, but this is merely an example, and the present invention is not limited thereto. For example, all of the driving voltage lines 172 may be omitted, or only one may be omitted.

In the case of the display device in which a portion of the driving voltage line 172 of the light transmissive region TA of the second display area DA2 is omitted as illustrated in FIG. 19 to FIG. 22, a driver 700 and the second display area DA2 may be disposed at opposite edges of the display device.

Figure 23:
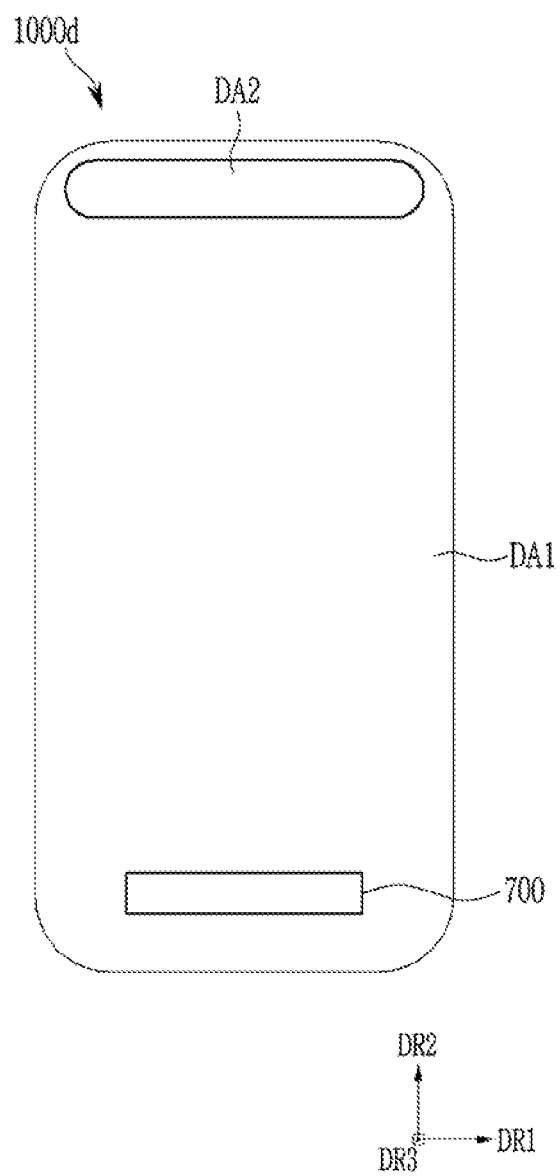
FIG. 23 is a schematic view illustrating a driver and a second display area in the display device according to the exemplary embodiment of FIGS. 19 to 22.

FIG. 23 illustrates the driver 700 and the second display area DA2 in a display device 1000d according to what is shown in FIG. 19 to FIG. 22. Referring to FIG. 23, the driver 700 and the second display area DA2 are disposed at opposite edges of the display device. Accordingly, the first display area DA1 is disposed between the driver 700 and the second display area DA2.

Since a voltage transferred from the driver 700 is transferred in the second display area DA2 after passing through the first display area DA1, the display quality of the first display area DA1 might not be affected even when a part of the driving voltage line 172 is omitted from the second display area DA2.

Hereinafter, a display device according to an exemplary embodiment of the present invention will be described.

Figure 24:
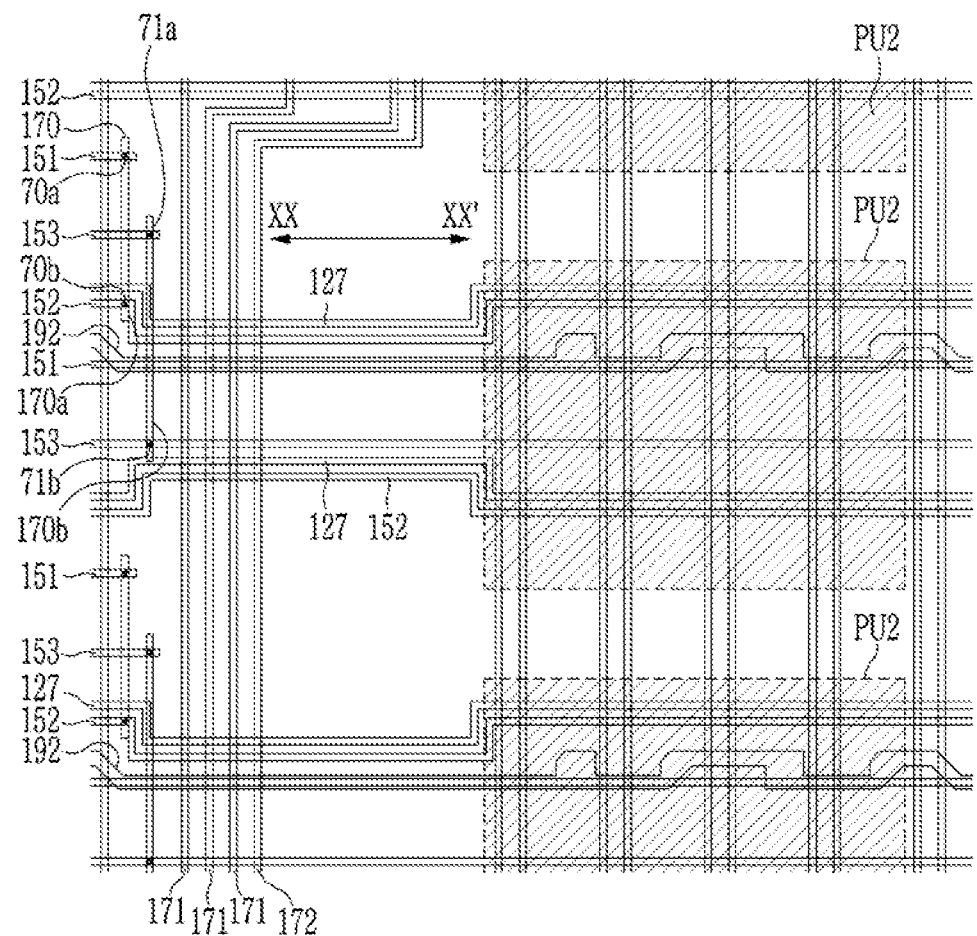
FIG. 24 is a schematic view illustrating a display device according to an exemplary embodiment of the present invention.

FIG. 24 is a schematic diagram illustrating a display device according to an exemplary embodiment of the present invention. Referring to FIG. 24, in the display device according to an exemplary embodiment, the data line 171 and the driving voltage line 172 are disposed together in the light transmissive region TA. In addition, portions of the scan lines 151 and 152 and the initialization voltage line 127 are bent and extended, thereby ensuring a wide empty space in the light transmissive region TA.

When FIG. 19 and FIG. 24 are compared, in the case where portions of the data line 171, the driving voltage line 172, the scan lines 151 and 152, and the initialization voltage line 127 are bent, one empty space is formed in the light transmissive region TA.

When a region where no wire is disposed is wide, an inorganic layer and an organic layer may be omitted in the light transmissive region TA, and thus the light transmittance in the light transmission region TA may be increased.

Figure 25:
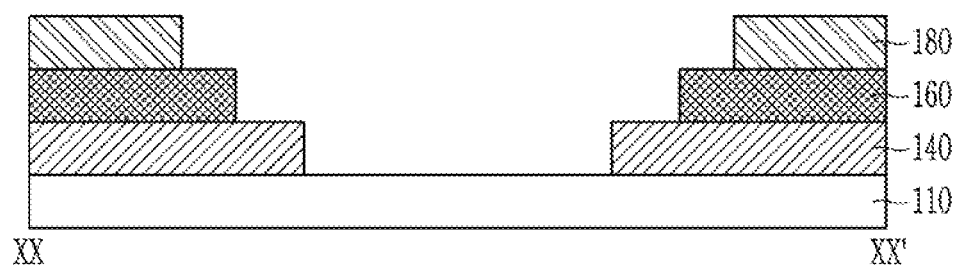
FIG. 25 is a schematic view illustrating a cross-sectional view taken along a line XX-XX' of FIG. 24.

FIG. 25 is a cross-sectional view taken along a line XX-XX' of FIG. 24. A sectional view of FIG. 25 is schematically illustrated based on a stacked structure of an inorganic layer and an organic layer. Referring to FIG. 25, a gate insulating layer 140, an interlayer insulating layer 160 as an organic layer, and a passivation layer 180 as an organic layer may be disposed on a substrate 110. Each layer may have an opening, and a width of the opening of a layer disposed away from the substrate 110 may be wider than that of the opening of a layer disposed close to the substrate 110.

Figure 26:
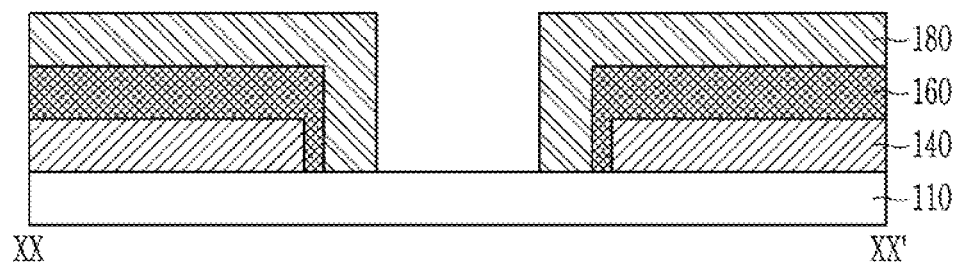
FIG. 26 is a cross-sectional view corresponding to that of FIG. 25 according to an exemplary embodiment of the present invention.

FIG. 26 is a cross-section corresponding to that of FIG. 25 according to an exemplary embodiment of the present invention. Referring to FIG. 26, the gate insulating layer 140 is an inorganic layer, the interlayer insulating layer 160 is an organic layer, and the passivation layer 180 is an organic layer. These layers may be sequentially disposed on the substrate 100. Each layer may have an opening, and a width of the opening of each layer may become smaller as the distance from the substrate 100 increases. Accordingly, as illustrated in FIG. 26, an edge of the opening of the gate insulating layer 140 may be covered with the interlayer insulating layer 160, and an edge of the interlayer insulating layer 160 may be covered with the passivation layer 180.

When a region where no wire is disposed is wide as illustrated in FIG. 24, portions of the gate insulating layer 140, which is an inorganic layer, the interlayer insulating layer 160, which is an organic layer, and the passivation layer 180, which is an organic layer, as shown in FIG. 25 and FIG. 26, may be omitted. When the inorganic layer/the organic layer/the organic layer are omitted, the light transmittance is increased within the omitted regions. As illustrated in FIG. 25 and FIG. 26, the opening of each layer gradually becomes smaller or larger as the distance from the substrate increases. This is a required structure for the etching process. Accordingly, when the region where no wire is disposed is wide as illustrated in FIG. 24, it is possible to omit the organic layers and the inorganic layers. When a gap between wires is narrow as illustrated in FIG. 19, it might not be easy to omit the inorganic layers and the organic layers, or an effect of increasing the light transmittance might not be great even though the layers are omitted.

Therefore, when portions of the wires are bent and gathered in the light transmissive region TA and an empty space where no wire is disposed is widened, the light transmittance of the light transmissive region TA may be increased by removing the inorganic layers, the organic layers, and the like.

Figure 27:
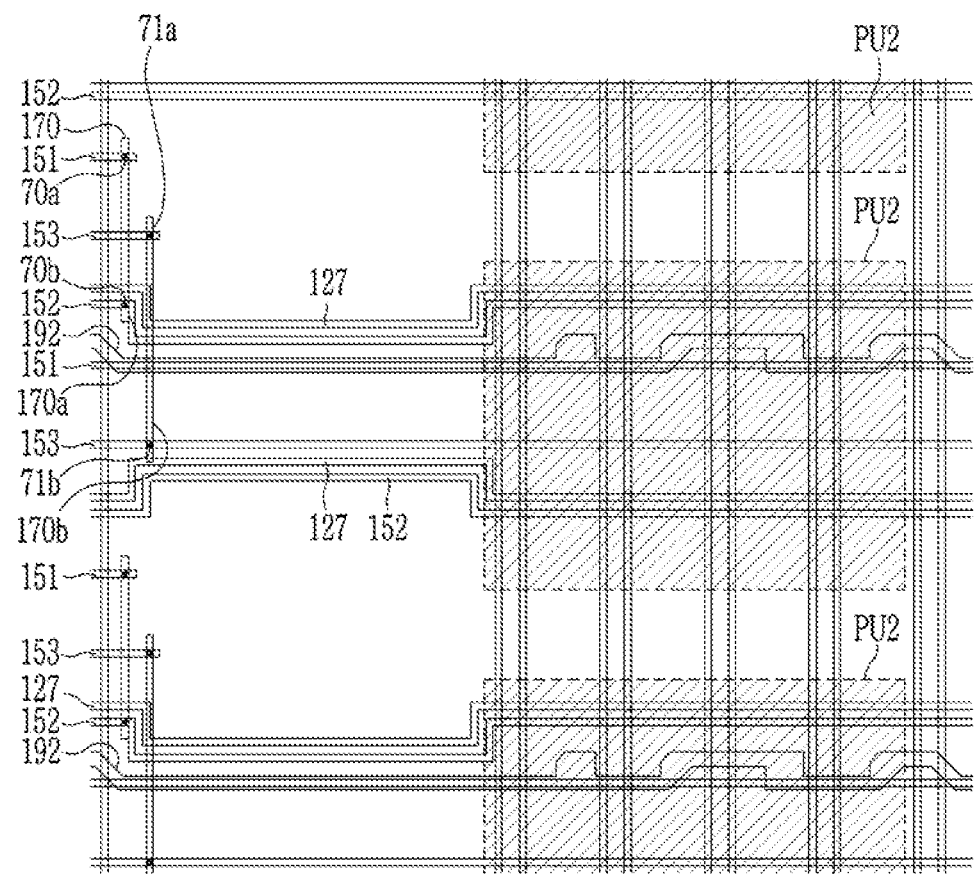
FIG. 27 is a schematic view illustrating a second display area of a display device according to an exemplary embodiment of the present disclosure.

FIG. 27 illustrates the second display area DA2 of a display device according to an exemplary embodiment of the present disclosure. Referring to FIG. 27, the data line 171 and the driving voltage line 172 are omitted in the light transmissive region TA of the second display area DA2. In addition, portions of the scan lines 151 and 152 and the initialization voltage line 127 are bent and extended, thereby ensuring a wide empty space in the light transmissive region TA.

Referring to FIG. 27, the data line 171 and the driving voltage line 172 are omitted, and thus an area of the empty space where no wire is disposed is wider than that of FIG. 26. Therefore, the inorganic layers and the organic layers may be widely omitted, and the effect of increasing the transmittance may be larger than that of the exemplary embodiment of FIG. 26.

Referring to FIG. 27, a positional relationship between the driver 700 and the second display area DA2 may be the same as that in FIG. 23. For example, as illustrated in FIG. 23, the driver 700 and the second display area DA2 may be disposed at opposite edges of the display device 1000d. In this case, since a voltage transferred from the driver 700 is transferred in the second display area DA2 after passing through the first display area DA1, the display quality of the first display area DA1 might not be affected even when portions of the data line 171 and the driving voltage line 172 are omitted from the second display area DA2.

Hereinafter, a display device according to an exemplary embodiment of the present invention will be described with reference to the drawings.

FIG. 28 illustrates the second display area DA2 of a display device according to an exemplary embodiment of the present disclosure. FIG. 29 illustrates the pixel region PU2 of FIG. 28 in more detail.

Referring to FIG. 28 and FIG. 29, the display device, according to an exemplary embodiment of the present disclosure, does not include the voltage line 192. Accordingly, the light transmittance can be increased because the light blocking by the voltage line 192 does not occur in the transmissive region TA.

In addition, referring to the pixel region PU2 of FIG. 28, since the voltage line 192 is not disposed in the pixel region PU2, each of the pixel electrodes 191a, 191b, and 191c is freely disposed. Therefore, the pixel electrodes 191a, 191b, and 191c are disposed inside the pixel region PU2, and the light transmittance of the transmissive region TA may be increased by not penetrating the transmissive region TA. In this case, the respective pixel electrodes 191a, 191b, and 191c may at least partially overlap the third transistor T3 as illustrated in FIG. 29.

In the present specification, the pixel region PU2 and the transmissive region TA are defined by using a wire constituting one pixel unit as a boundary.

For example, when one pixel includes seven transistors, the boundary of one pixel region may be defined as an area occupied by the seven transistors.

The voltage line 192 at least partially overlaps the third transistor T3 so as to serve as a light-blocking layer of the third transistor T3. However, in the display device according to an exemplary embodiment, the voltage line 192 is omitted, and each of the pixel electrodes 191a, 191b, and 191c at least partially overlaps the third transistor T3. Accordingly, the light incident on the third transistor T3 is cut off by the pixel electrodes 191a, 191b, and 191c, and thus the threshold voltage of the third transistor T3 can be prevented from being changed even without the voltage line 192.

Referring to FIG. 28, the pixel electrodes 191a, 191b, and 191c are freely arranged in the pixel region PU2 because the voltage line 192 is not located in the pixel region PU2.

Therefore, each of the pixel electrodes 191a, 191b, and 191c may at least partially overlap the active pattern 130 of the pixel region PU2, the scan lines 151 and 152, and the control line 153, and the overlapping with the active pattern 130 may be minimized. A region where the scan lines 151 and 152, the control line 153, and the like are disposed in the pixel region PU2 is a region where the light transmittance is reduced by wires. Accordingly, when the pixel electrodes 191a, 191b, and 191 at least partially overlap the scan lines 151 and 152 and the control line 153, they are disposed in the region where light is already blocked, and thus additional light blocking by the pixel electrodes 191a, 191b, and 191c does not occur. Therefore, the light transmittance may be increased in the second display area DA2.

However, when the voltage line 192 is disposed within the pixel region PU2, each of the pixel electrodes 191a, 191b, and 191c at least partially overlaps the scan line etc. disposed in the transmissive region TA due to a space occupied by the voltage line 192, and in this case, the light transmittance of the transmissive region TA may be reduced by the pixel electrodes 191a, 191b, and 191c. However, in the display device according to an exemplary embodiment, the voltage line 192 is omitted so that the pixel electrodes 191a, 191b, and 191c at least partially overlap the wires in the pixel regions PU2 and do not penetrate the transmissive region TA, and thus the light transmittance of the transmissive area TA is not reduced.

Referring to FIG. 28, the first scan line 151 and the control line 153 in the transmissive region TA may be bent to be disposed close to the second scan line 152 and the initialization voltage line 127, adjacent thereto. Thus, an area of an empty space where no wire is disposed in the transmissive region TA is widened. Therefore, as illustrated in FIG. 24 to FIG. 26, the organic layer, the inorganic layer, and the like in the transmissive region TA may be omitted to further increase the transmittance.

Hereinafter, the pixel disposition of the pixel region PU2 of the display device according to an exemplary embodiment will be described in detail with reference to the drawings. FIG. 29 illustrates the pixel disposition of the pixel region PU2 of the FIG. 28 in detail.

Referring to FIG. 29, the emissive display device, according to an exemplary embodiment of the present disclosure, includes a scan line 151 extending along a first direction DR1 to transfer a scan signal Sn, a second scan line 152 for transferring the previous-stage scan signal S(n−1), a control line 153 for transferring the light emission control signal EM, and an initialization voltage line 127 for transferring the initialization voltage Vint. A bypass signal GB is transferred through the second scan line 152.

The emissive display includes the data line 171 that extends in a second direction DR2 that is orthogonal to the first direction DR1 to transfer the data voltage Dm and the driving voltage line 172 for transferring the driving voltage ELVDD.

The emissive display includes a driving transistor T1, a second transistor T2, a third transistor T3, a fourth transistor T4, a fifth transistor T5, a sixth transistor T6, a seventh transistor T7, and a storage capacitor Cst and a light-emitting diode LED.

Each channel of the driving transistor T1, the second transistor T2, the third transistor T3, the fourth transistor T4, the fifth transistor T5, the sixth transistor T6, and the seventh transistor T7 is disposed in the active pattern 130 which extends longitudinally. In addition, at least portions of the first and second electrodes of the transistors T1, T2, T3, T4, T5, T6, and T7 are disposed in the active pattern 130. The active pattern 130 (which is shaded in FIG. 29) may be bent in various shapes. The active pattern 130 may include an oxide semiconductor or a polycrystalline semiconductor made of polysilicon.

The active pattern 130 includes a channel doped with an N-type impurity or a P-type impurity, and a first doped region and a second doped region disposed at opposite sides of the channel and having a higher doping concentration than an impurity doped in the channel. The first doped region and the second doped region correspond to the first electrode and the second electrode of the plurality of transistors T1, T2, T3, T4, T5, T6, and T7, respectively. When one of the first doped region and the second doped region is a source region, the other doped region is a drain region. In addition, regions between the first electrodes and the second electrodes of different transistors may be doped in the active pattern 130 such that the transistors may be electrically connected to each other.

Each channel of the transistors T1, T2, T3, T4, T5, T6, and T7 at least partially overlaps a gate electrode of each of the transistors T1, T2, T3, T4, 15, T6, and T7, and is disposed between the first electrode and the second electrode of each of the transistors T1, T2, T3, T4, T5, T6, and T7. The transistors T1, T2, T3, T4, T5, T6, and T7 may have substantially the same stacked structure. Hereinafter, the driving transistor T1 will be described in detail, and the remaining transistors T2, T3, T4, T5, T6, and T7 will be briefly described.

The driving transistor T1 includes a channel, a first gate electrode 155, a first electrode S1, and a second electrode D1. The channel of the driving transistor T1 is disposed between the first electrode S1 and the second electrode D1 to at least partially overlap the first gate electrode 155 in a plan view. The channel is curved in order to form a longer channel length within a limited region. As the length of the channel becomes longer, a driving range of the gate voltage Vg applied to the first gate electrode 155 of the driving transistor T1 is widened and a driving current Id is constantly increased depending on the gate voltage Vg. As a result, it is possible to control a gray level of light emitted from the light-emitting diode LED more finely and to increase display quality of the light emitting diode display by adjusting a magnitude of the gate voltage Vg. In addition, since the channel extends in various directions rather than extending in one direction, the effect of the orientation is offset in the manufacturing process, thereby reducing a process scattering influence. Accordingly, it is possible to prevent image quality deterioration such as a stain defect that may occur by a characteristic variation of the driving transistor T1 depending on regions of the display device due to process scattering (e.g., a luminance difference occurring depending on the pixel even when a same data voltage Dm is applied). A shape of such channels may be variously modified without being limited to the illustrated Ω form.

The first gate electrode 155 at least partially overlaps the channel in a plan view. The first electrode S1 and the second electrode D1 are disposed at opposite sides of the channel, respectively. An insulated extension of the storage line 126 is disposed on the first gate electrode 155. The extension of the storage line 126 at least partially overlaps the gate electrode 155, with a second gate insulating layer interposed therebetween in a plan view to constitute a storage capacitor Cst. The extension of the storage line 126 is the first storage electrode of the storage capacitor Cst, and the first gate electrode 155 constitutes the second storage electrode. The extension of the storage line 126 has an opening 56 such that the first gate electrode 155 may be connected to a first data connector 71. In the opening 56, an upper surface of the first gate electrode 155 and the first data connector 71 are electrically connected to each other through a contact hole 61. The first data connector 71 is connected to the second electrode D3 of the third transistor T3 to connect the gate electrode 155 of the driving transistor T1 to the second electrode D3 of the third transistor T3.

A gate electrode of the second transistor T2 may be a portion of the scan line 151. The data line 171 is connected to a first electrode S2 of the second transistor T2 through a contact hole 62. The first electrode S2 and the second electrode D2 may be disposed on the active pattern 130.

The third transistor T3 may be formed to include two transistors adjacent to each other. A mark T3 is illustrated at a left side and a lower side with reference to a portion where the active pattern 130 is folded in the pixel PX of FIG. 29. These two parts each serve as the third transistor T3. A first electrode S3 of a first third transistor T3 is connected to a second electrode D3 of a second third transistor T3. A gate electrode of the two transistors T3 may be a portion of the scan line 151 or a portion that protrudes upward from the scan line 151. Such a structure may be referred to as a dual-gate structure, and may prevent a leakage current from flowing. The first electrode S3 of the third transistor T3 is connected to a first electrode S6 of the sixth transistor T6 and the second electrode D1 of the driving transistor T1. The second electrode D3 of the third transistor T3 is connected to the first data connector 71 through a contact hole 63.

The fourth transistor T4 is also formed to include two fourth transistors T4, and the two fourth transistors T4 are formed at a portion where the second scan line 152 and the active pattern 130 meet each other. A gate electrode of the second transistor T2 may be a portion of the second scan line 152. A first electrode S4 of a first fourth transistor T4 is connected to a second electrode D4 of a second fourth transistor T4. Such a structure may be referred to as a dual-gate structure, and may prevent a leakage current from flowing. A second data connector 72 is connected to the first electrode S4 of the fourth transistor T4 through a contact hole 65, and a first the data connector 71 is connected to the second electrode D4 of the fourth transistor T4 through the contact hole 63.

As such, a dual-gate structure may be used by using the third transistor T3 and the fourth transistor T4 to effectively prevent occurrence of a leakage current by blocking an electron movement path of the channel in an off state.

A gate electrode of the fifth transistor T5 may be a portion of the control line 153. The driving voltage line 172 is connected to a first electrode S5 of the fifth transistor T5 through a contact hole 67, and a second electrode D5 is connected to the first electrode S1 of the driving transistor T1 through the active pattern 130.

A gate electrode of the sixth transistor T6 may be a portion of the control line 153. A third data connector 73 is connected to a second electrode D6 of the sixth transistor T6 through a contact hole 69, and a first electrode S6 is connected to the second electrode D1 of the driving transistor through the active pattern 130.

A gate electrode of the seventh transistor T7 may be a portion of the second scan line 152. A first electrode S7 of the seventh transistor T7 is connected to the second electrode D6 of the sixth transistor T6, and a second electrode D7 is connected to the first electrode S4 of the fourth transistor T4.

The second data connector 72 is connected to the initialization voltage line 127 through a contact hole 64. A pixel electrode may be connected to a third data connector 73 through a contact hole 81.

A parasitic capacitor control pattern 79 may be disposed between the dual gate electrodes of the compensation transistor T3. A parasitic capacitor exists in the pixel, and an image quality characteristic thereof may vary when a voltage applied to the parasitic capacitor changes. The driving voltage line 172 is connected to the parasitic capacitor control pattern 79 through a contact hole 66. As a result, the image quality characteristic may be prevented from being varied by applying the driving voltage ELVDD having a constant DC voltage to the parasitic capacitor. The parasitic capacitor control pattern 79 may be disposed in a different region than the illustrated position, and a voltage other than the driving voltage ELVDD may be applied thereto.

A first end of the first data connector 71 is connected to the gate electrode 155 through the contact hole 61, and a second end thereof is connected to the second electrode D3 of the third transistor T3 and the second electrode D4 of the fourth transistor T4 through the contact hole 63.

A first end of the second data connector 72 is connected to the first electrode S4 of the fourth transistor T4 through the contact hole 65, and a second end thereof is connected to the initialization voltage line 127 through the contact hole 64.

The third data connector 73 is connected to the second electrode of the sixth transistor T6 though the contact hole 69.

Each of the pixel electrodes 191a, 191b, and 191c may be connected to the third data connector 73 through contact holes 81.

The pixel electrodes may include a first pixel electrode 191a, a second pixel electrode 191b, and a third pixel electrode 191c.

The first pixel electrode 191a may at least partially overlap the first transistor T1 and the third transistor. The first pixel electrode 191a has a widest width in the first direction DR1 between the first scan line 151 and the second scan line 152.

The second pixel electrode 191b may at least partially overlap the third transistor T3 and the fourth transistor T4. The second pixel electrode 191b has a widest width in the first direction DR1 in a region overlapping the second scan line 152.

The third pixel electrode 191c may at least partially overlap the first transistor T1 and the third transistor. The first pixel electrode 191a has a widest width in the first direction DR1 between the first scan line 151 and the second scan line 152.

The planar shapes of the first pixel electrode 191a and the third pixel electrode 191c may be similar. However, an area of the third pixel electrode 191c may be larger than that of the first pixel electrode 191a.

Referring again to FIG. 28, each of the pixel electrodes 191a, 191b, and 191c may at least partially overlap color filters 230R, 230G, and 230B. The first pixel electrode 191a may at least partially overlap the first color filter 230R representing red, and the second pixel electrode 191b may at least partially overlap the second color filter 230G representing green, and the third pixel electrode 191c may at least partially overlap the third color filter 230B representing blue.

As described above, the display device, according to exemplary embodiments of the present invention, has different pixel densities in the first display area DA1 and the second display area DA2. The second display area DA2 may include the pixel region PU2 and the transmissive region TA, and may change the disposition of the voltage line 192 in the transmissive region TA or omit portions of the scan lines 151 and 152, omit portions of the data line 171 and the driving voltage line 172, or change the disposition of the wires, so as to increase the light transmittance of the transmissive region TA. In addition, the light transmittance of the transmissive region TA may be increased by removing the voltage line 192 from the pixel region PU2 of the second display area DA2 and disposing the pixel electrodes 191a, 191b, and 191c within the pixel region PU2.

While exemplary embodiments of the present invention have been described in connection with the illustrative drawings, it is to be understood that the invention is not limited to the disclosed embodiments, but, on the contrary, is intended to cover various modifications and equivalent arrangements included within the spirit and scope of the specification.

What is claimed is:

1. A display device, comprising:
a first display area including a plurality of first pixel regions; and
a second display area including both a plurality of second pixel regions and a plurality of light transmissive regions,
wherein the second display area further includes a plurality of scan lines,
wherein the second pixel region includes a plurality of pixel electrodes and a voltage line disposed on a same layer as the plurality of pixel electrodes, and
wherein the voltage line at least partially overlaps the plurality of scan lines so as to be parallel therewith in the light transmissive region.

2. The display device of claim 1, wherein the plurality of pixel electrodes is absent from the light transmissive region.

3. The display device of claim 1, wherein:
the second display area includes a plurality of wires,
the plurality of wires include a plurality of scan lines and control lines extending primarily in a first direction and a plurality of data lines and driving voltage line extending primarily in a second direction, and
portions of the plurality of wires are bent so as to be closer to each other in the light transmissive region than if the wires were straight.

4. The display device of claim 3, wherein an interval between some of the plurality of wires in the light transmissive region is smaller than an interval between the wires of the plurality of wires in the second pixel region.

5. The display device of claim 3, wherein a portion of the light transmissive region where none of the plurality of wires are disposed has an opening that is formed by partially removing inorganic layers and organic layers.

6. The display device of claim 1, wherein:
the second display area includes a plurality of data lines and a plurality of driving voltage lines, and
one or more of the plurality of driving voltage lines are absent from the light transmissive region.

7. The display device of claim 6, further comprising:
a driver,
wherein the first display area is disposed between the driver and the second display area.

8. The display device of claim 6, wherein one or more of the plurality, of data lines are absent from the light transmissive region.

9. The display device of claim 1, wherein:
the second display area further includes a control line, and portions of the plurality of scan lines and the control line are absent from the light transmission region.

10. The display device of claim 9, wherein:
the plurality of scan lines include a first scan line and a second scan line, and
a portion of the first scan line is connected to the second scan line of an adjacent pixel column.

11. The display device of claim 9, wherein a portion of the control line is connected to a control line of an adjacent pixel column.

12. A display device comprising:
a first display area including a plurality of first pixel regions; and
a second display area including both a plurality of second pixel regions and a plurality of light transmissive regions,
wherein the second display area includes a plurality of wires,
wherein the plurality of wires includes a plurality of scan lines extending primarily in a first direction, a plurality control lines extending primarily in the first direction, a plurality of data lines extending primarily in a second direction, and a plurality of driving voltage line extending primarily in the second direction, and
wherein at least one of the plurality of wires is absent from the light transmissive region.

13. The display device of claim 12, wherein:
the second pixel region includes a plurality of pixels electrodes,
the second pixel region does not include a voltage line disposed on a same layer as the plurality of pixel electrodes, and
none of the plurality of pixel electrodes overlap the light transmissive region.

14. The display device of claim 12, further comprising a driver, wherein the first display area is disposed between the driver and the second display area.

15. The display device of claim 12, wherein portions of the plurality of wires are bent to be closer to each other in the light transmissive region than if they were straight.

16. The display device of claim 15, wherein an interval between some of the plurality of wires in the light transmissive region is smaller than an interval between the wires of the plurality of wires in the second pixel region.

17. The display device of claim 16, wherein a portion of the light transmissive region where no wires of the plurality of wires are disposed has an opening that is formed by partially removing inorganic layers and organic layers.

18. A display device, comprising:
a first display area including a plurality of first pixel regions; and
a second display area including a plurality of second pixel regions and a plurality of light transmissive regions,
wherein the second display area includes a plurality of wires,
wherein the plurality of wires includes a plurality of scan lines extending primarily in a first direction, a plurality of control lines extending primarily in the first direction, a plurality of data lines extending primarily in a second direction, and driving voltage line extending primarily in the second direction,
wherein portions of the plurality of wires are bent in the light transmissive region, and
wherein an interval between some wires of the plurality of wires in the light transmissive region is smaller than an interval between wires of the plurality of wires in the second pixel region.

19. The display device of claim 18, wherein:
- the second pixel region includes a plurality of pixel electrodes,
- the second pixel region does not include a voltage line disposed on a same layer as the plurality of pixel electrodes, and
- the plurality of pixel electrodes do not overlap the light transmissive region.

20. The display device of claim 18, wherein a portion of the light transmissive region where no wires of the plurality of wires are disposed has an opening that is formed by partially removing inorganic layers and organic layers.

21. The display device of claim 19, wherein the plurality of pixel electrodes is not disposed in the light transmissive region.

* * * * *